(12) United States Patent
Pollman et al.

(10) Patent No.: US 10,958,312 B2
(45) Date of Patent: Mar. 23, 2021

(54) MIMO ANTENNA MODULE AND MIMO ANTENNA UNIT FOR DISTRIBUTED ANTENNA SYSTEM

(71) Applicant: CommScope Technologies LLC, Hickory, NC (US)

(72) Inventors: Michael Pollman, Londonderry, NH (US); Kevin E. Craig, Dudley, MA (US); David Davies, Chelmsford, MA (US); Stephen Ledingham, Waltham, MA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/287,610

(22) Filed: Feb. 27, 2019

(65) Prior Publication Data
US 2019/0268045 A1    Aug. 29, 2019

Related U.S. Application Data

(60) Provisional application No. 62/635,981, filed on Feb. 27, 2018.

(51) Int. Cl.
*H04B 7/022*    (2017.01)
*H01Q 1/38*    (2006.01)
(Continued)

(52) U.S. Cl.
CPC .............. *H04B 7/022* (2013.01); *H01Q 1/38* (2013.01); *H01Q 21/24* (2013.01);
(Continued)

(58) Field of Classification Search
CPC ........ H04B 7/022; H04B 7/0413; H01Q 1/38; H01Q 21/24; H01Q 1/2291; H01Q 1/246; H01Q 23/00
See application file for complete search history.

(56) References Cited

U.S. PATENT DOCUMENTS 10,097,391 B2    10/2018    Fertonani et al.
10,355,895 B2    7/2019    Barbieri et al.
(Continued)

FOREIGN PATENT DOCUMENTS

EP    3269118 A2    1/2018
WO    2016145371 A2    9/2016
(Continued)

OTHER PUBLICATIONS

International Searching Authority, "International Search Report and Written Opinion from PCT Application No. PCT/US2019/019819 dated Jun. 14, 2019", from Foreign Counterpart to U.S. Appl. No. 16/287,610, pp. 1-12 Published: WO.
(Continued)

*Primary Examiner* — Nguyen T Vo
(74) *Attorney, Agent, or Firm* — Fogg & Powers LLC

(57) ABSTRACT

An embodiment of an antenna module includes a substrate, a first antenna, and a second antenna. The first antenna is disposed on the substrate and is configured to radiate a first signal having a wavelength and a first polarization. And the second antenna is disposed on the substrate and is configured to radiate a second signal having the wavelength and a second polarization that is approximately orthogonal to the first polarization. For example, such an antenna module can include, as the first antenna, a T antenna configured to transmit and receive data that forms a first part of a MIMO-OFDM data symbol, and can include, as the second antenna, an F antenna configured to transmit and receive data that forms a second part of the MIMO-OFDM data symbol.

16 Claims, 15 Drawing Sheets

(51) Int. Cl.
*H01Q 21/24* (2006.01)
*H01Q 23/00* (2006.01)
*H01Q 1/22* (2006.01)
*H01Q 1/24* (2006.01)
*H04B 7/0413* (2017.01)

(52) U.S. Cl.
CPC .......... *H01Q 1/2291* (2013.01); *H01Q 1/246* (2013.01); *H01Q 23/00* (2013.01); *H04B 7/0413* (2013.01)

(56) References Cited

U.S. PATENT DOCUMENTS

| | | | |
|---|---|---|---|
| 10,608,734 B2 | 3/2020 | Barbieri et al. | |
| 10,616,016 B2 | 4/2020 | Fertonani et al. | |
| 2008/0198082 A1* | 8/2008 | Soler Castany | H01Q 1/242 343/770 |
| 2011/0090131 A1* | 4/2011 | Chen | H01Q 19/30 343/815 |
| 2011/0244914 A1* | 10/2011 | Venkatraman | H04W 52/40 455/522 |
| 2012/0326943 A1 | 12/2012 | Flores-Cuadras et al. | |
| 2016/0127065 A1 | 5/2016 | Schwab et al. | |
| 2016/0329933 A1 | 11/2016 | Kummetz et al. | |
| 2017/0033471 A1* | 2/2017 | Huang | H01Q 21/26 |
| 2017/0195015 A1 | 7/2017 | Schmid et al. | |
| 2018/0013597 A1 | 1/2018 | Barbieri et al. | |
| 2019/0007246 A1 | 1/2019 | Fertonani et al. | |
| 2019/0116568 A1 | 4/2019 | Fertonani et al. | |
| 2019/0208575 A1 | 7/2019 | Barbieri et al. | |
| 2020/0204252 A1 | 6/2020 | Barbieri et al. | |

FOREIGN PATENT DOCUMENTS

| | | |
|---|---|---|
| WO | 2017070635 A1 | 4/2017 |
| WO | 2018017468 A1 | 1/2018 |

OTHER PUBLICATIONS

Wang et al., "Correlation Coefficient Expression by S-parameters for Two Omni-Directional MIMO Antennas"; 2011 IEEE International Symposium on Antennas and Propagation (APSURSI); Jul. 3-8, 2011; Dept. Electrical and Computer Enginering National University of Singapore; Singapore; pp. 301-304.

AfsarUddin et al., "High Bandwidth F-Shaped Microstrip Patch Antenna for C-band Communications," International Journal fo Advanced Research in Computer and Communication Engineering, vol. 6; Issue 3; Mar. 2017; pp. 1 through 4.

International Searching Authority, "International Preliminary Report on Patentability from PCT Application No. PCT/US2019/019819 dated Aug. 27, 2020", From PCT Counterpart of U.S. Appl. No. 16/287,610; pp. 1 through 9; Published in WO.

Ni et al., "T-Shaped Antenna Loading T-Shaped Slots for Multiple band Operation", Progress in Electromagnetics Research C, vol. 53, 2014, pp. 45-53.

* cited by examiner

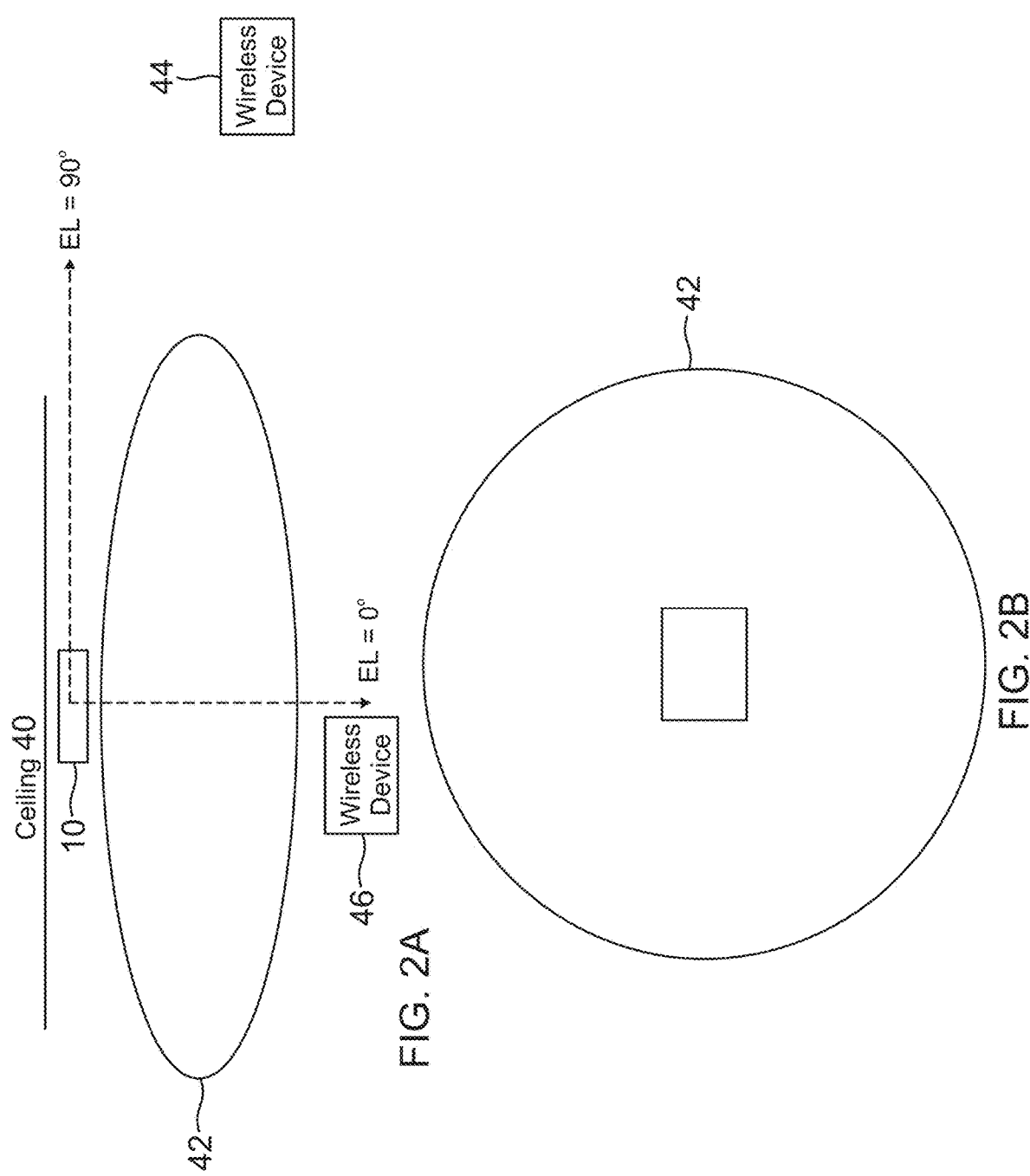

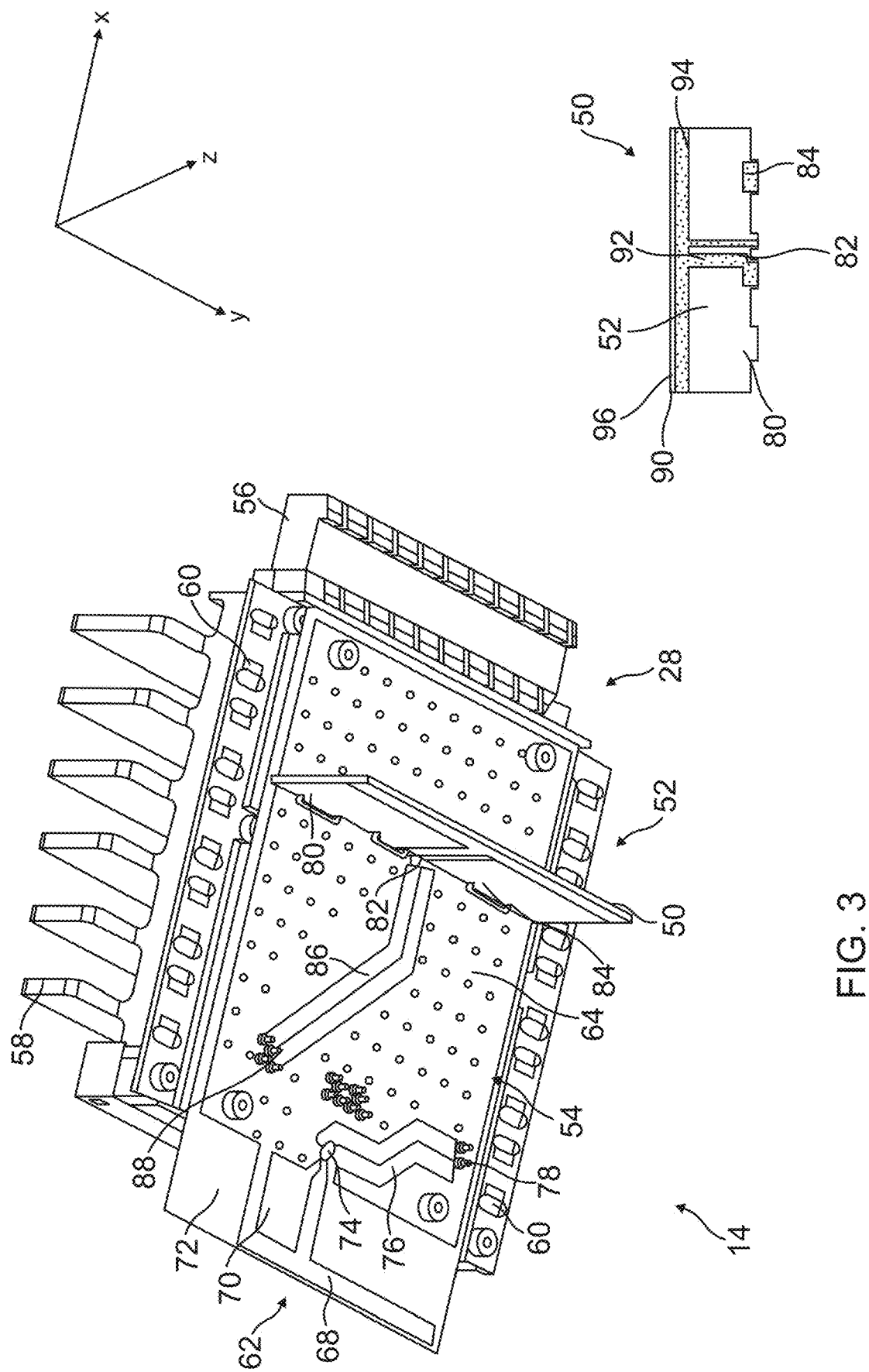

T Antenna

Inverted F Antenna

MIMO ANTENNA MODULE AND MIMO ANTENNA UNIT FOR DISTRIBUTED ANTENNA SYSTEM

CROSS-REFERENCE TO RELATED APPLICATIONS

This application claims benefit of U.S. Provisional Application No. 62/635,981 filed on Feb. 27, 2018 and titled "MIMO ANTENNA MODULE AND MIMO ANTENNA UNIT FOR DISTRIBUTED ANTENNA SYSTEM", the contents of which are incorporated herein in its entirety.

SUMMARY

Remote antenna units of a distributed antenna system (DAS) typically are distributed within a structure (e.g., an office building, warehouse, mall) to provide wireless-communication coverage so that people can use their wireless devices while within the structure. Examples of the types of wireless coverage that a DAS can provide include Wi-Fi®, and cellular and data service over one of the many available long-term-evolution (LTE) frequency bands (e.g., B1, B3, B7, B25, and B66). And the frequency range over which the DAS can be configured to operate is, for example, approximately 700 MHz-6000 MHz (6.00 GHz).

Because there are many available wireless-communication protocols and frequency bands, it can be cost and time prohibitive to design, test, and manufacture a respective remote antenna unit for each possible combination of protocols and frequency bands that a designer may wish to include in a DAS.

Furthermore, to improve bandwidth and data-transfer speed as compared to a single-input-single-output (SISO) antenna unit, it can be desirable to incorporate multiple-input-multiple-output (MIMO) capability into a remote antenna unit. For example, it can be desirable to incorporate MIMO-orthogonal-frequency-division-multiplexing (MIMO-OFDM) capability into a remote antenna unit.

But MIMO-OFDM antenna-spacing requirements can increase the size and form factor of a remote antenna unit beyond a desired size and form factor, or, alternatively, can require locating the antennas remote from the main housing of the remote antenna unit. The latter is often undesirable because the need to connect remote antennas to the main housing can significantly increase the installation complexity of a DAS, and the medium (e.g., coaxial cables) used to couple the remote antennas to the main housing often introduces significant loss into the transmitted and received signals.

Therefore, an embodiment of a remote antenna unit includes a common baseband module (hereinafter a controller module) and one or more radio modules (hereinafter antenna modules) that are each configured for plug-and-play connection to the controller module at the time of installation, and that are each configured for MIMO-OFDM operation according to at least one respective wireless protocol and for at least one respective frequency band of the respective protocol. Furthermore, the multiple antennas associated with an antenna module are mounted to a substrate (e.g., a circuit board) of the antenna module, and, therefore, are part of, not remote from, the antenna module.

By including a common (i.e., single-version) controller module, such a remote antenna unit promotes reduced design, manufacturing, and testing costs as compared to the costs of designing, manufacturing, and testing multiple versions of a controller module.

Furthermore, such a remote antenna unit allows one to custom design a DAS by acquiring radio modules configured to operate according to desired wireless protocols and in desired frequency bands, and by connecting one or more of the acquired radio modules to each of the control modules during installation of the DAS.

Moreover, by including MIMO-OFDM antennas that are mounted to a board of the antenna module and that are relatively close together (e.g., spaced apart by less than $\lambda/2$), such an antenna module allows the remote antenna unit to have a reduced form factor and size as compared to an antenna unit having remote antennas, i.e., antennas that are not part of the antenna unit.

In addition, each version of the antenna module can be designed, manufactured, and tested independently of the common controller module and the other versions of the antenna module such that a change to one version of the antenna module, or an introduction of a new version of the antenna module, does not require redesigning, retesting, or recertifying (e.g., for FCC compliance) the other existing versions of the antenna module.

An embodiment of such an antenna module includes a substrate, a first antenna, and a second antenna. The first antenna is disposed on the substrate and is configured to radiate a first signal including a wavelength and having a first polarization. And the second antenna is disposed on the substrate and is configured to radiate a second signal including the same wavelength and having second polarization that is approximately orthogonal to the first polarization.

For example, such an antenna module can include, as the first antenna, an F antenna configured to transmit and receive data that forms a first MIMO-OFDM data symbol, and can include, as the second antenna, a T antenna configured to transmit and receive data that forms a second MIMO-OFDM data symbol.

And an embodiment of a remote antenna unit includes a controller module and one or more antenna modules. The controller module includes a first substrate and at least one antenna-module connection region. And each of the at least one antenna module is configured for engagement with an antenna-module connection region of the control module, and includes a respective second substrate, a respective first antenna disposed on the respective second substrate and configured to radiate a respective first signal including a respective wavelength and having a respective first polarization, and a respective second antenna disposed on the respective second substrate and configured to radiate a respective second signal including the same respective wavelength and having a respective second polarization that is approximately orthogonal to the respective first polarization.

For example, such a remote antenna unit allows one to connect the antenna modules to the controller module in a plug-and-play fashion during installation of a DAS so that he/she can customize the remote antenna unit, and, therefore, the DAS, without any special tools or set-up procedures. Furthermore, the controller module and antenna modules are configured such that when the one or more antenna modules are properly engaged with the controller module, the controller module and one or more antenna modules can fit within a single housing having a desired form factor and size.

DRAWINGS

FIGS. 2A and 2B are diagrams of a side view and of a top-down view, respectively, of a desired radiation pattern of the remote antenna unit of FIG. 1, according to an embodiment.

FIG. 3 is a bottom isometric view of an antenna module of FIG. 1, according to an embodiment.

FIG. 4 is a side view of a T-antenna assembly of FIG. 3, according to an embodiment.

DETAILED DESCRIPTION

"Approximately," "substantially," and similar words, as used herein, indicate that a given quantity b can be within a range b±10% of b, or b±1 if |10% of b|<1. "Approximately," "substantially," and similar words, as used herein, also indicate that a range b–c can be from b–0.10(c–b) to c+0.10(c–b). Regarding the planarity of a surface or other region, "approximately," "substantially," and similar words, as used herein, indicate that a difference in thickness between a highest point and a lowest point of the surface/region does not exceed 0.20 millimeters (mm).

Figure 1:
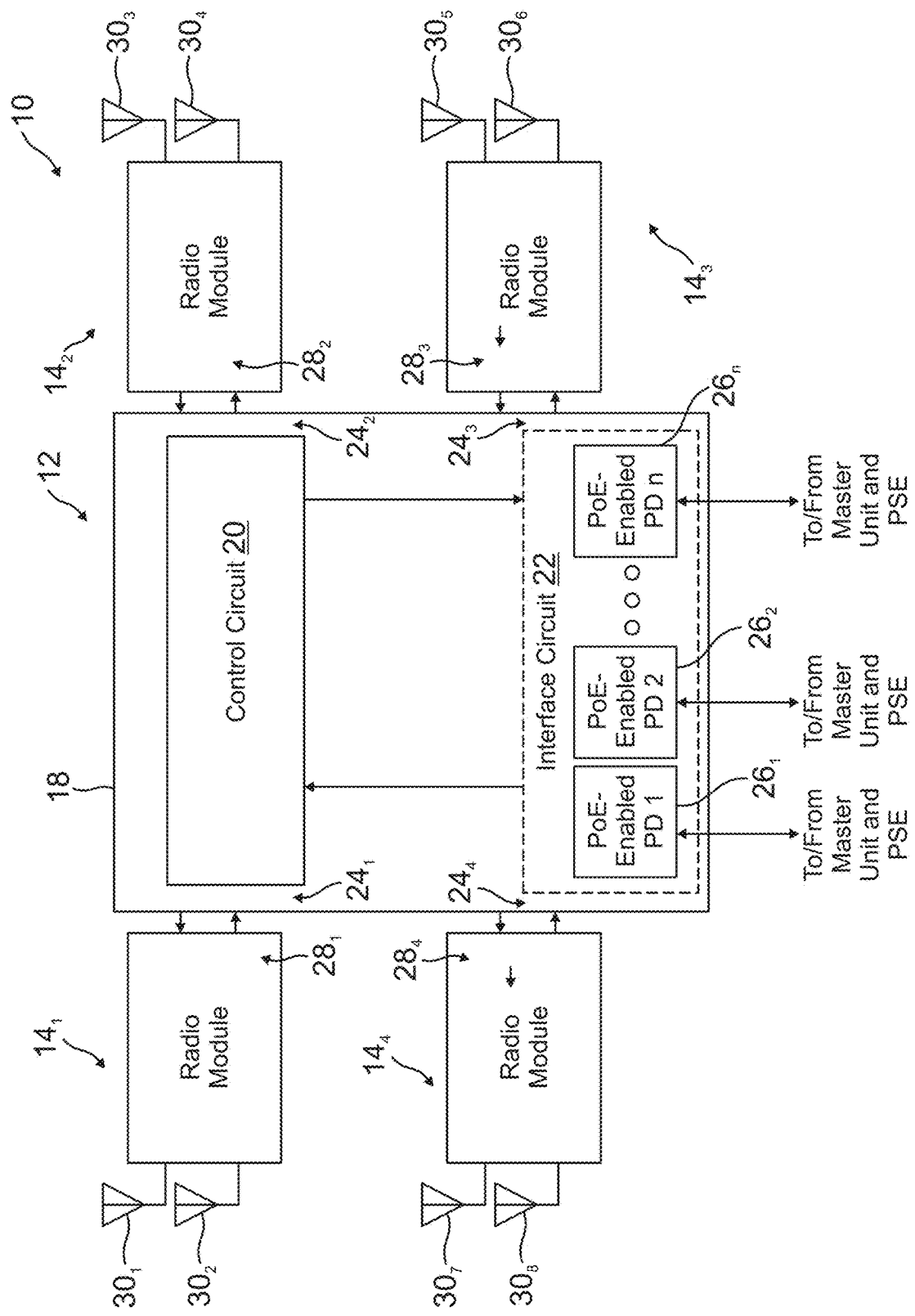
FIG. 1 is a diagram of a remote antenna unit that includes a control module and four antenna modules, according to an embodiment.

FIG. 1 is a diagram of a modular remote antenna unit 10 (sometimes called a "remote transmit/receive module," or a "remote unit") of a distributed antenna system (DAS), according to an embodiment. The antenna unit 10 includes a controller module 12 and one or more (here four) MIMO-OFDM (here 2×2) antenna modules $14_1$-$14_4$ configured for removable attachment and electrical coupling to the controller module. The modularity of the antenna unit 10 allows one to design, manufacture, test, and certify (e.g., certify for FCC compliance) only a single version of the controller module 12, and allows him/her to customize the remote antenna unit 10, and, therefore, the DAS to which the remote antenna unit belongs, by installing different versions of the antenna modules 14. That is, one who is charged with designing a DAS for a particular structure can customize the DAS to operate according to one or more desired wireless protocols and frequency bands by acquiring the corresponding version of the antenna modules 14 and attaching the acquired antenna modules to the respective controller modules 12 during installation of the DAS. For example, to customize a DAS system to support a Wi-Fi® protocol and the B1, B25, and B66 LTE bands, one could attach, to each controller module 12, a respective Wi-Fi® antenna module 14, a respective B1 antenna module, a respective B25 antenna module, and a respective B66 antenna module. The modularity of the remote antenna unit 10 also allows one to modify the remote antenna unit, and the DAS to which it belongs, after installation by replacing one of more of the antenna modules 14 with other versions of the antenna modules.

Still referring to FIG. 1, the controller module 12 includes a substrate (e.g., a printed circuit board) 18, a control circuit 20 mounted to the substrate, an interface circuit 22 mounted to the substrate, and antenna-module connection regions $24_1$-$24_4$ formed in the substrate.

The control circuit 20 is configured to control the antenna modules 14, the interface circuit 22, and other circuitry (not shown in FIG. 1) on board the remote antenna unit 10. The control circuit 20 can be any suitable type, or suitable combination, of a software-configurable, firmware-configurable, or hard-wired control circuit, such as a microprocessor, microcontroller, field-programmable gate array (FPGA), and an application-specific integrated circuit (ASIC).

The interface circuit 22 is configured to communicate with a master unit (not shown in FIG. 1) of the DAS, and to provide power to the antenna unit 10. For example, the interface circuit 20 can include one or more Power-over-Ethernet (PoE) powered devices (PDs) $26_1$-$26_n$, such as a 1000BASE-T PoE-enabled powered device and a 2.5 GHz/5.0 GHz/10.0 GHz NBASE-T PoE-enabled powered device, can be configured to receive power from power-source equipment (not shown in FIG. 1), and can be configured to communicate with the master unit, via a suitable PoE cable (not shown in FIG. 1). In operation, the interface circuit 22 can communicate data from the master unit to one or more of the antenna modules 14 for transmission, and can communicate data received from one or more of the antenna modules to the master unit.

And the antenna-module connection regions 24 are each configured to engage a connection region (described below) of an antenna module 14 so that the antenna module is physically and electrically coupled to the controller module 12. As further described below in conjunction with FIGS. 14-16, each connection region 24 can be configured to couple a conductive region (hereinafter a "ground plane") plane of the antenna module 14 to a ground plane of the controller module 12.

Each antenna module 14 includes a controller-module connection region 28 configured to engage an antenna-module connection region 24 of the controller module 12, includes multiple (here two) antennas 30, and includes circuitry configured to transmit and to receive data via the antennas according to a MIMO-OFDM protocol. As described below in conjunction with FIGS. 14-16, the connection region 28 can be configured to couple a ground plane of the antenna module 14 to a ground plane of the controller module 12. As described below in conjunction with FIGS. 3-4 and 11-12, the antennas 30 of the antenna module 14 can be configured to have a suitably low envelope correlation coefficient and a suitably high level of signal isolation between them. Furthermore, during a transmit mode, the antenna-module circuitry is configured to split data received from the master unit (not shown in FIG. 1) via the interface circuit 22 into two data symbols, one data symbol for each of the antennas 30, and to transmit the data symbols via the respective antennas according to a wireless protocol, and on a frequency band, for which the antenna module 14 is configured. And during a receive mode, the antenna-module circuitry is configured to recover, and to provide to the master unit via the interface circuit 22, data symbols respectively received from the antennas 30 according to a wireless protocol, and on a frequency band, for which the antenna module 14 is configured. Because a MIMO-OFDM protocol calls for each of the antennas 30 of the antenna unit 14 to transmit and to receive on a same frequency band and using a same set of subcarrier frequencies, signals transmitted by the antennas typically include at least one same wavelength, and signals received by the antennas typically include at least one same wavelength.

Still referring to FIG. 1, alternate embodiments of the remote antenna unit 10 are contemplated. For example, the antenna unit 10 can be other than a remote antenna unit of a DAS. Furthermore, the antenna unit 10 can omit some of the above-described components, and can include components not described. Moreover, one or more of the antenna modules 14 can be other than a 2×2 MIMO-OFDM module. In addition, alternate embodiments described in conjunction with FIGS. 2-17 may be applicable to the remote antenna unit 10.

FIGS. 2A and 2B are a side view and a top view, respectively, of a radiation pattern 42, which the antennas 30 (FIG. 1) of the remote antenna unit 10 are configured to form, according to an embodiment. That is, each set of antennas 30 of each of the antenna modules 14 is configured, at least ideally, to form the radiation pattern 42. For example, the antennas 30₁-30₂ of the antenna module 14₁ are configured to form, at least ideally, the radiation pattern 42, the antennas 30₃-30₄ of the antenna module 142 are configured to form, at least ideally, the radiation pattern 42, the antennas 30₅-30₆ of the antenna module 14e are configured to form, at least ideally, the radiation pattern 42, and the antennas 30₇-30₈ of the antenna module 14₄ are configured to form, at least ideally, the radiation pattern 42.

Referring to FIG. 2A, the remote antenna unit 10 is typically mounted to, or inside of, a ceiling 40 of the structure in which it is installed.

Furthermore, the radiation pattern 42 has a higher gain near EL=90°, and a lower gain near EL=0°. Because of the higher gain near EL=90°, the radiation pattern 42 provides sufficient signal power to a wireless device 44 located some non-zero horizontal distance away from the antenna unit 10. And even with a lower gain near EL=0°, the radiation pattern 42 still provides sufficient signal power to a wireless device 46 located approximately directly under the antenna unit 10 because the distance between the antenna unit and wireless device 46 is relatively small. For example, the radiation pattern 42 can provide a maximum gain within an approximate ranges of 270°≤EL≤345° and 15°≤EL≤90°.

And referring to FIG. 2B, in a plane approximately parallel to the ceiling 40 (FIG. 2A), the radiation pattern 42 is, ideally, omni-directional, i.e., the radiation pattern 42 is, ideally, omni-directional in the azimuth dimension.

Still referring to FIGS. 2A-2B, alternate embodiments of the radiation pattern 42 are contemplated. For example, the antennas 30 of the antenna unit 10 can be configured to generate any suitable radiation pattern other than the radiation pattern 42. In addition, alternate embodiments described in conjunction with FIGS. 1 and 3-17 may be applicable to the radiation pattern 42.

FIG. 3 is a bottom isometric view of an antenna module 14 of FIG. 1, according to an embodiment in which the two MIMO-OFDM antennas 30 of FIG. 1 are a T antenna and an F antenna, respectively.

FIG. 4 is a side view of the T-antenna substrate 50 of the antenna module 14 of FIG. 3, and of the T antenna 52 disposed on the T-antenna substrate, according to an embodiment.

Referring to FIG. 3, in addition to the connection region 28 and the T-antenna substrate 50, the antenna module 14 includes an antenna-module substrate 54, a signal connector 56, a heatsink 58, ground-plane contacts 60, circuitry (not shown in FIG. 3), and an F antenna 62.

The T antenna 52 and the F antenna 62, in the described embodiment, are the antennas 30 of FIG. 2.

The connection region 28 is a slot that is configured to receive and engage a connection region 24 of FIG. 1, where the connection region 24 includes a corresponding portion of the substrate 18 of the controller module 12 of FIG. 1. By engaging a corresponding portion of the substrate 18, the connection region 28 facilitates good electrical contact between the ground plane (described below) of the substrate 18 and the ground plane (described below) of the substrate 50, such that the antennas 52 and 62 of the antenna module 14 effectively "see" one ground plane. Without good electrical contact between the ground planes, the radiation patterns of the antennas 52 and 62 can differ significantly from their designed parameters.

The antenna-module substrate 54 can be any type of suitable substrate, such as a printed-circuit board, and includes a conductive region 64, which is called a ground region or plane if, as is here, the conductive region is grounded. Although shown as being the bottom external layer of the substrate 54, the ground plane 64 can be in inner layer or the top layer of the substrate. Furthermore, the substrate 54, and thus the ground plane 64, lie approximately in the x-y plane. Moreover, if the ground plane 64 is the bottom layer of the substrate 54, then the substrate can include a layer of an electric insulator over the ground plane to prevent short circuits to ground.

The signal connector 56 can be any suitable connector configured for engaging with a corresponding connector (not shown) on the controller module 12 of FIG. 1 to couple signals (e.g., data signals for transmission, received data signals, power and ground signals) between the circuitry onboard the antenna module 14 and the circuitry on the controller module.

The heat sink 58 is configured to dissipate heat generated by the circuitry and the antennas 52 and 62 of the antenna module 14, and to dissipate heat generated by the controller module 12 (FIG. 1) while the antenna module is coupled to the controller module. The heat sink 58 can be formed from any suitable material (e.g., a metal such as aluminum) and can have any suitable shape.

The ground-plane contacts 60 are configured to couple, electrically, the ground plane of the substrate 18 of the controller module 12 (FIG. 1) to the ground plane 64 while the connector region 28 is engaged with a connector region

24 (FIG. 1) of the controller module. The ground-plane contacts 60 can have any suitable composition and structure; for example, each of the ground-plane contacts can be a respective D-shaped spring contact made from beryllium. Furthermore, the substrate 54 can include conductive vias for coupling the ground-plane contacts 60 to the ground plane 64.

The antenna-module circuitry (not shown in FIG. 3) is disposed to a side of the antenna-module substrate 54 opposite to the side on which the T and F antennas 52 and 62 are disposed, and is configured to perform functions such as error encoding and MIMO-OFDM encoding data, modulating, with the encoded data, subcarrier signals and a carrier signal for transmission, demodulating received carrier signals, and MIMO-OFDM decoding and error decoding received data. The antenna-module circuitry can include, for example, software-configurable circuitry such as a microprocessor or micro controller, firmware-configurable circuitry such as a field-programmable gate array (FPGA), hardwired circuitry, or a subcombination or combination of software-configurable, firmware-configurable, and hardwired circuitry.

The F antenna 62 (also referred to as an inverted-F antenna (IFA) or a printed-F antenna (PFA)) depending on its orientation relative to the viewer) includes conductors 68, 70, and 72 disposed on the antenna-module substrate 54 adjacent to, and in approximately the same plane as, the ground plane 64. Because it is disposed approximately coplanar with the ground plane 64, the F antenna 62 allows the antenna module 14, and, therefore, the antenna unit 10 (FIG. 1), to have a relatively low height (i.e., a relatively low profile) as described below.

The conductor 68 of the F antenna 62 is approximately $\lambda/4$ long, where $\lambda$, is the center frequency of the frequency band for which the antenna module 14 is configured.

The conductor 70 of the F antenna 62 is coupled to the antenna-module circuitry by a signal-feed node 74, a signal-feed trace 76, and a through-substrate via 78. In series with the signal-feed trace 76 can be disposed circuitry configured to match, approximately, the impedance "seen" by the antenna 62 to the impedance of the antenna.

The conductors 70 and 72 of the F antenna 62 can have any suitable length, such as less than $\lambda/8$. Furthermore, the minimum width of the ground plane 64, as measured from the end of the conductor 72 in contact with the ground plane, is approximately $\lambda/4$, although in the described embodiment, this width of the ground plane is $\gg\lambda/4$. In an embodiment in which a designer wishes to maintain the sizes of the F antenna 62 relatively consistent from one version of the antenna module 14 to another version of the antenna module, the dimensions of the conductors 70 and 72, and other dimensions of and distances within the antenna module, may be fractions of $\lambda$ that are different from those fractions described above depending on the frequency band(s) for which an antenna module is configured.

The signal that the F antenna 62 is configured to transmit (hereinafter "radiate") has an electric field (hereinafter "E-field") that is generally in the x dimension, i.e., that is approximately perpendicular to the conductor 68, and that is approximately parallel to the conductors 70 and 72. That is, the E-field polarization of the signal, and, therefore, the E-field polarization of the F antenna 62, is generally in the x dimension, although the E-field polarization of the signal and F antenna may also have a component in they dimension. As described below, this E-field polarization is configured to provide a suitably high level of isolation (i.e., a suitably low level of inductive and capacitive coupling), and a suitably low envelope correlation coefficient, between the T antenna 52 and the F antenna 62, and, therefore, is configured to allow the T and F antennas to be spaced apart by less than $\lambda/2$.

Furthermore, the F antenna 62 is configured to receive an incoming signal having an E-field component in the x dimension; if an incoming signal has no E-field component approximately in the x dimension, then the signal is orthogonal to the primary polarization of the F antenna 62, which, therefore, may be unable to receive the incoming signal with a suitable gain.

And, ideally, the F antenna 62 is configured to generate an omni-directional radiation pattern, such as the radiation pattern 42 of FIGS. 2A-2B; actual examples of the radiation pattern of the F antenna 62 are described below in conjunction with FIGS. 6, 8A-8B, and 10.

Referring to FIGS. 3-4, the T-antenna substrate 50 is attached to the antenna-module substrate 54 via tabs 80, 82, and 84. The tabs 80 and 84 function to hold the T-antenna substrate 50 to the antenna-module substrate 54, and the tab 82 functions to hold the T-antenna substrate to the antenna-module substrate and to electrically couple the T antenna 52 to the antenna-module circuitry via a signal-feed trace 86 and input via 88 disposed on the substrate 54. In series with the signal-feed trace 86 can be disposed circuitry configured to match, approximately, the impedance "seen" by the T antenna 52 to the impedance of the antenna.

The T antenna 52 includes conductors 90, 92, and 94, where the conductors 90 and 94 are disposed along an edge 96 of the T-antenna substrate 50, and the conductor 92 is disposed approximately in the center of, and is approximately perpendicular to, the conductors 90 and 94. Furthermore, the antenna-module circuitry drives the conductor 92 of the T antenna 52 with a signal to be transmitted, and receives incoming signals from the conductor 92 of the T antenna, via the conductive tab 82, which electrically couples the conductor 92 to the antenna-module circuitry (not shown in FIG. 3) on the opposite side of the antenna-module substrate 54.

In general, the T antenna 52 operates like a $\lambda/4$ monopole antenna disposed over a ground plane (the conductor 92 radiates a current-generated signal into the far field), but the conductors 90 and 94 add capacitance, which allows the conductor 92 to be shorter than a $\lambda/4$ monopole antenna, with the tradeoff that the bandwidth of a T antenna configured for operation at a particular center frequency is typically less than the bandwidth of a $\lambda/4$ monopole antenna configured for operation at the same center frequency. For example, the lengths of the conductors 90 and 94 can be set such that the height of the conductor 92 can be no more than approximately seventeen millimeters (mm), regardless of the frequency band for which the T antenna 52 is configured, to allow the antenna module 14 to have a desired height and profile.

The signal that the T antenna 52 is configured to radiate has an E field that is in the z dimension, i.e., has an E field that is approximately parallel to the conductor 92, and that is approximately perpendicular to the conductors 90 and 94. That is, the E-field polarization of the signal, and, therefore, of the T antenna 52, is in the z dimension. As described below, this E-field polarization provides a suitably high level of isolation (i.e., a suitably low level of inductive and capacitive coupling), and a suitably low envelope correlation coefficient, between the T antenna 52 and the F antenna 62, and, therefore, is configured to allow the T and F antennas to be spaced apart by less than λ/2 (the T and F antennas also can be spaced apart by λ/2 or by more than λ/2).

Furthermore, the T antenna 52 is configured to receive an incoming signal having an E-field component in the z dimension; if an incoming signal has no E-field component approximately in the z dimension, then the incoming signal is approximately orthogonal to the T antenna 52, which, therefore, may be unable to receive the incoming signal with a suitable gain.

And, ideally, the T antenna 52 is configured to generate an omni-directional radiation pattern, such as the radiation pattern 42 of FIGS. 2A-2B; actual examples of the radiation pattern of the T antenna 52 are described below in conjunction with FIGS. 5, 7A-7B, and 9.

Still referring to FIGS. 3-4, because the E-field polarizations of the T antenna 52 and the F antenna 62 are approximately orthogonal to one another, the levels of inductive (mutual) and capacitive coupling between the T and F antennas is relatively low, ideally zero, and the level of isolation between the T and F antennas is relatively high, ideally infinite.

A relatively high isolation means that the T antenna 52 receives little, if any, energy from a signal radiated by the F antenna 62, and that the F antenna receives little, if any, energy from a signal radiated by the T antenna. Said another way, a signal radiated by the T antenna 52 causes little or no interference with a signal received by the F antenna 62, and a signal radiated by the F antenna causes little or no interference with a signal received by the T antenna.

Furthermore, a relatively high isolation means that T antenna 52 has relatively little, if any, effect on the radiation pattern of the F antenna 62, and that the F antenna has relatively little, if any, effect on the radiation pattern of the T antenna; said another way, a relatively high isolation renders the F and T antennas substantially independent from one another.

Another benefit of a relatively high level of isolation is that the T antenna 52 and the F antenna 62 can be spaced apart by less than λ/2. According to the Diffraction Theorem and the Wave Number Theorem, for two antennas that have similar radiation characteristics to appear as independent radiators in the far field, they should be spaced apart by at least λ/2. But because the T antenna 52 and the F antenna 62 have a relatively high level of isolation between them, they can, at least in some applications, appear as independent radiators in the far field even if they are spaced apart by less than λ/2. The ability to space the T antenna 52 and the F antenna 62 apart by less than λ/2 allows a reduction in the size of the antenna module 14, and of the antenna unit 10 (FIG. 1), as compared to antenna modules and antenna units having MIMO-OFDM antenna pairs spaced apart by at least λ/2.

Yet another benefit of a relatively high level of isolation is that the T antenna 52 and the F antenna 62 are relatively highly de-correlated from one, another, i.e., the envelope correlation coefficient between the T and F antennas is relatively small. MIMO-OFDM techniques rely on the channels over which the T and F antennas 52 and 62 transmit and receive signals exhibiting spatial diversity. For relatively long channels, the spatial diversity typically is provided by the respective multiple paths of different distances that form each of the channels; that is, the spatial diversity is due to multipath. But for relatively short channels, such as where a wireless device 46 (FIG. 2A) is directly below the antenna unit 10 (FIG. 2A), multipath alone may not provide a sufficient level of spatial diversity. But configuring the T and F antennas 52 and 62 to have a relatively small envelope correlation coefficient can provide a suitable level of spatial diversity even over relatively short channels.

And a benefit of configuring the antenna module 14 for operation over only a given one or more frequency bands is that the T and F antennas 52 and 62 can be relatively narrow-band antennas, which typically have more uniform in-band radiation patterns versus wavelength than do antennas that are relatively wide-band antennas.

Still referring to FIGS. 3-4, in summary, the T antenna 52 and the F antenna 62 are configured, and are oriented relative to one another, such that the level of isolation between the T and F antennas is relatively high (ideally infinite), and such that the envelope correlation coefficient for the T and F antennas is relatively small (ideally zero).

Figure 5:
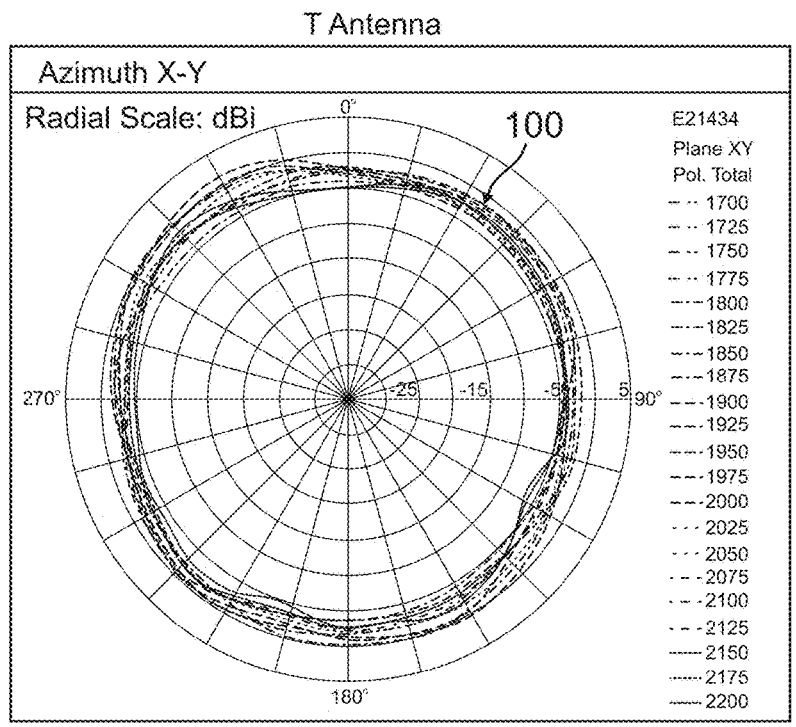
FIG. 5 is a two-dimensional plot of the radiation pattern of the T antenna of FIGS. 3-4, according to an embodiment.

FIG. 5 is a two-dimensional plot of the radiation pattern 100 of the T antenna 52 of FIGS. 3-4 in the x-y plane of FIG. 3 over an approximate frequency range of 1700 to 2200 MHz, according to an embodiment. The radiation pattern 100 is approximately a dipole-type omni-directional as is desired for at least some applications of the antenna unit 10 as described above in conjunction with FIG. 2B.

Figure 6:
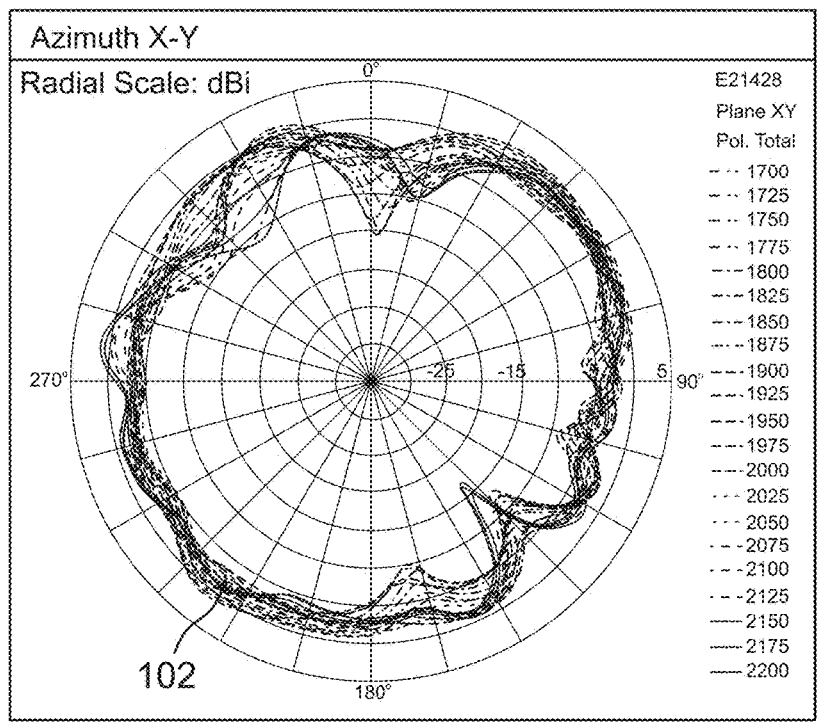
FIG. 6 is a two-dimensional plot of the radiation pattern of the F antenna of FIG. 3, according to an embodiment.

FIG. 6 is a two-dimensional plot of the radiation pattern 102 of the F antenna 62 of FIG. 3 in the x-y plane of FIG. 3 over an approximate frequency range of 1700 to 2200 MHz, according to an embodiment. The radiation pattern 102 is approximately omni-directional as is desired for at least some applications of the antenna unit 10 as described above in conjunction with FIG. 2B.

Figure 7A:
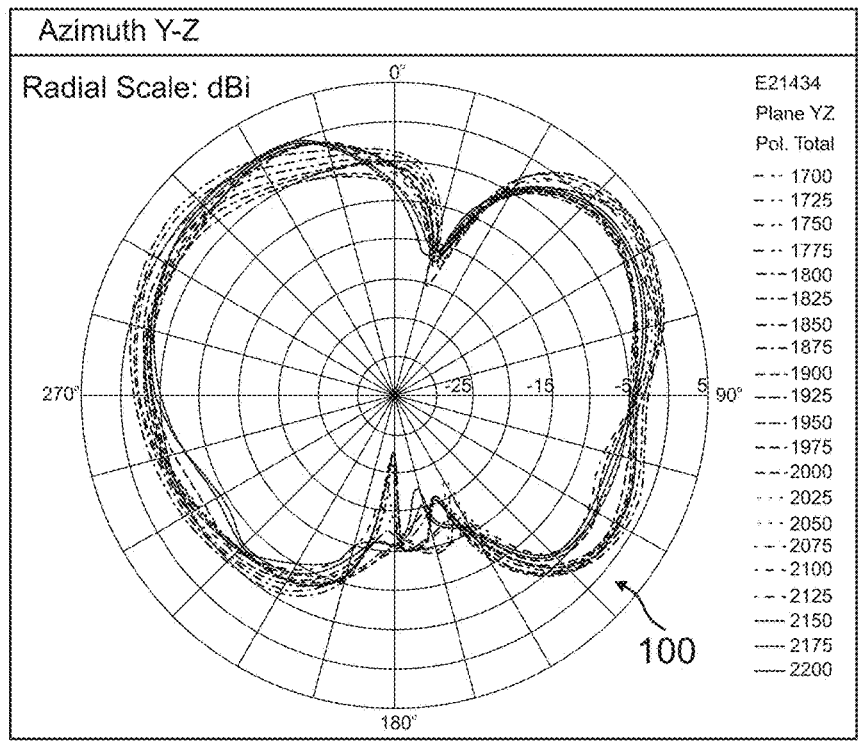
FIGS. 7A-7B are respective other two-dimensional plots of the radiation pattern of the T antenna of FIGS. 3-4, according to an embodiment.
Figure 7B:
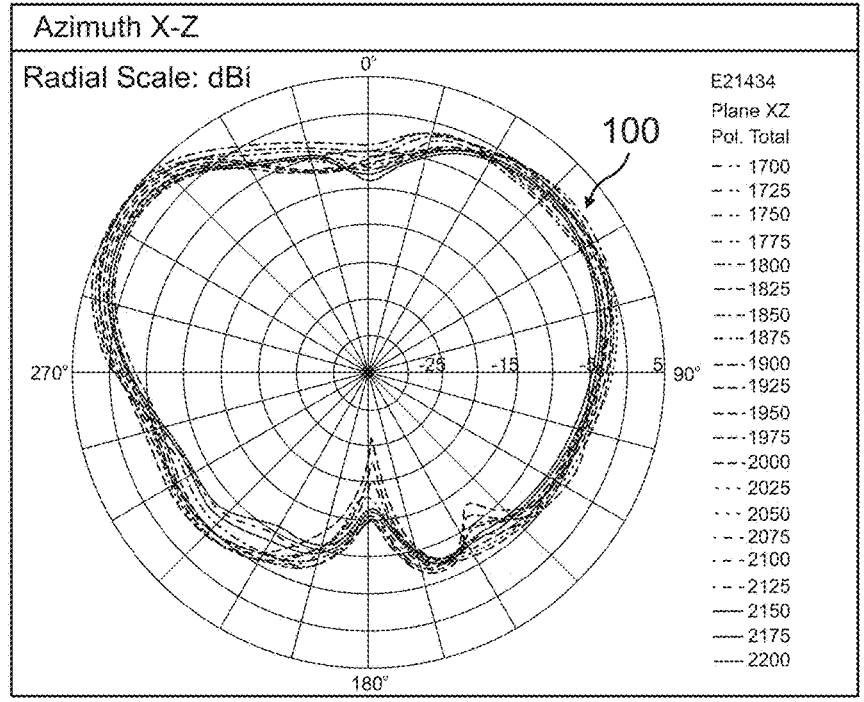

FIGS. 7A-7B are respective two-dimensional plots of the radiation pattern 100 of the T antenna 52 of FIGS. 3-4 in the y-z and x-z planes of FIG. 3 over an approximate frequency range of 1700 to 2200 MHz, according to an embodiment. The radiation pattern 100 has lower gain at elevation angles EL=0° (directly under the antenna unit 10) and EL=180° (directly over the antenna unit) as is desired for at least some applications of the antenna unit as described above in conjunction with FIGS. 2A-2B.

Figure 8A:
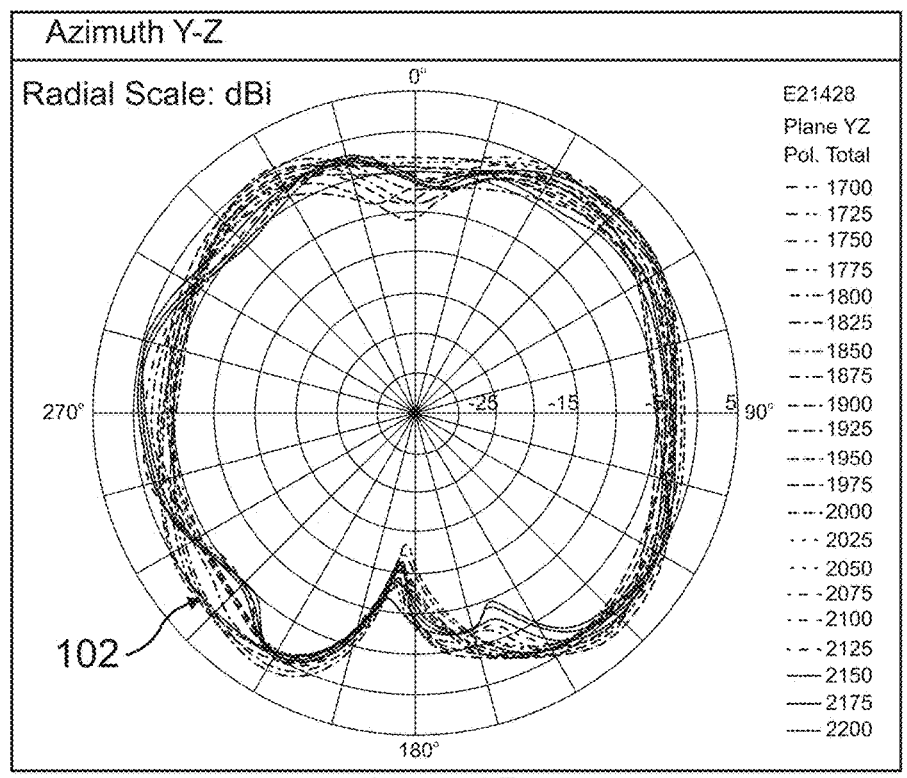
FIGS. 8A-8B are respective other two-dimensional plots of the radiation pattern of the F antenna of FIG. 3, according to an embodiment.
Figure 8B:
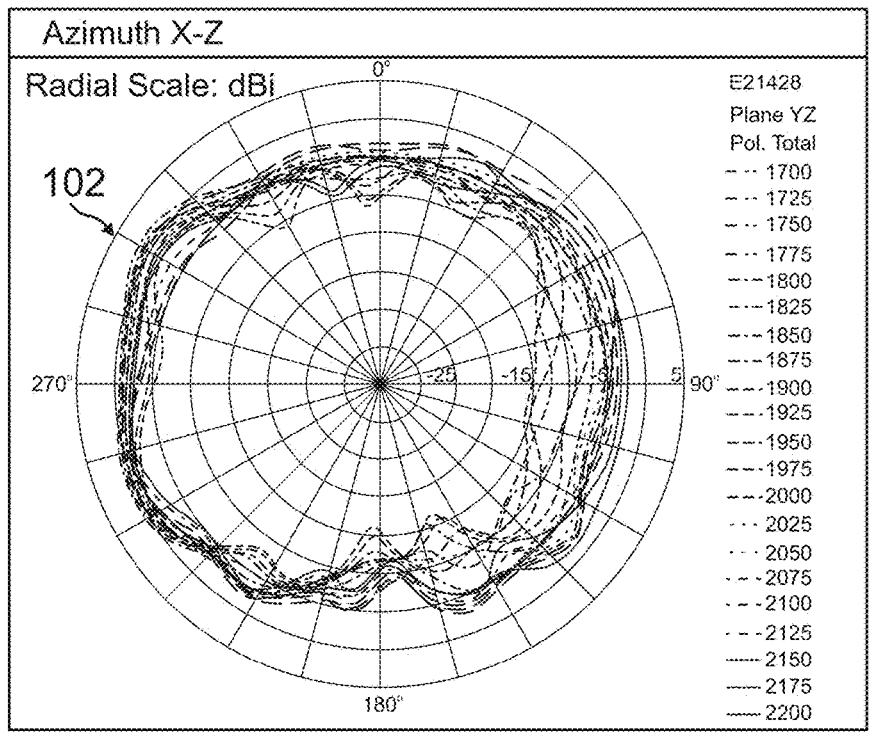

FIGS. 8A-8B are respective two-dimensional plots of the radiation pattern 102 of the F antenna 62 of FIG. 3 in the y-z and x-z planes of FIG. 3 over an approximate frequency range of 1700 to 2200 MHz, according to an embodiment. The radiation pattern 102 has lower gain at elevation angles EL=0° (directly under the antenna unit 10) and EL=180° (directly over the antenna unit) as is desired for at least some applications of the antenna unit as described above in conjunction with FIGS. 2A-2B.

Figure 9:
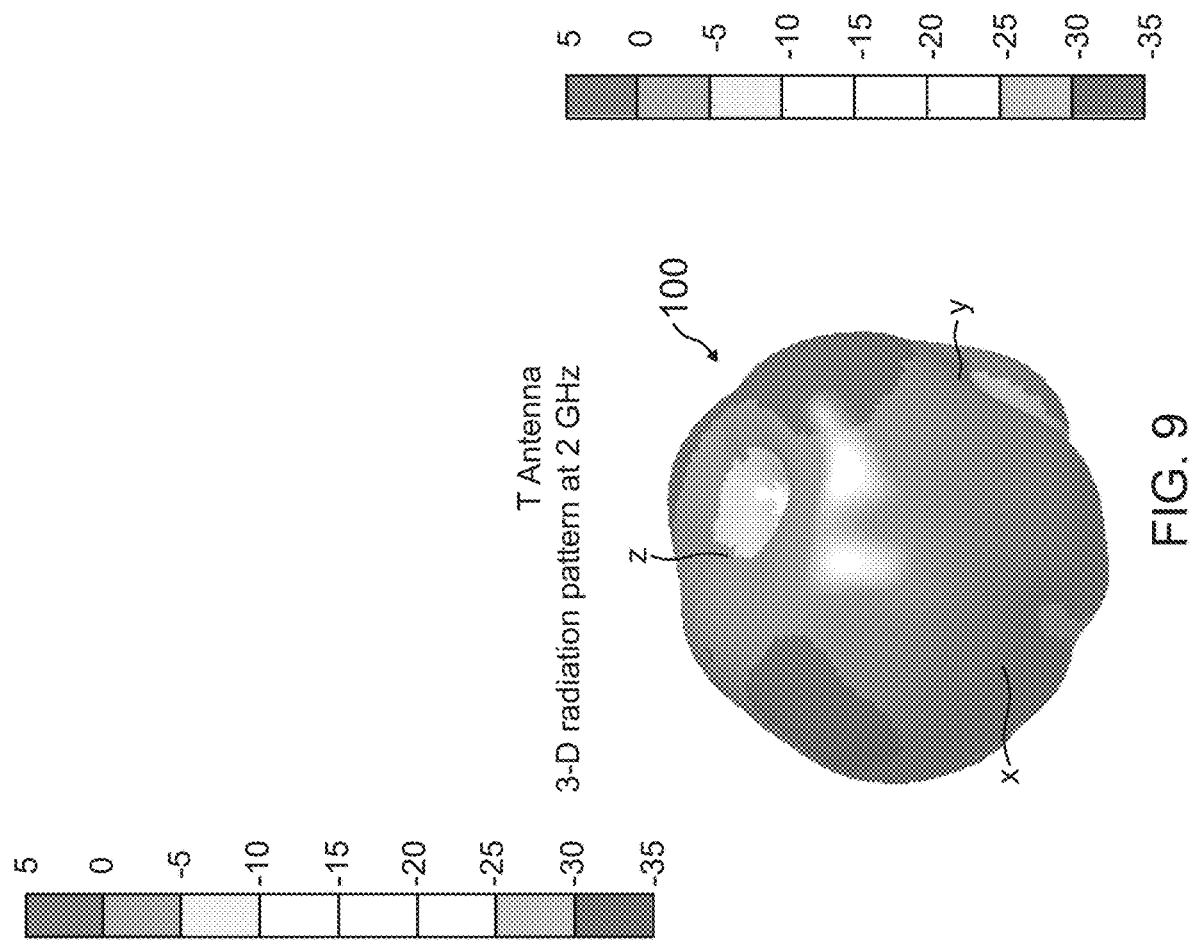
FIG. 9 is a three-dimensional plot of the radiation pattern of the T antenna of FIGS. 3-4, according to an embodiment.

FIG. 9 is a three-dimensional plot of the radiation pattern 100 of the T antenna 52 of FIGS. 3-4 at a frequency of 2 GHz, according to an embodiment.

Figure 10:
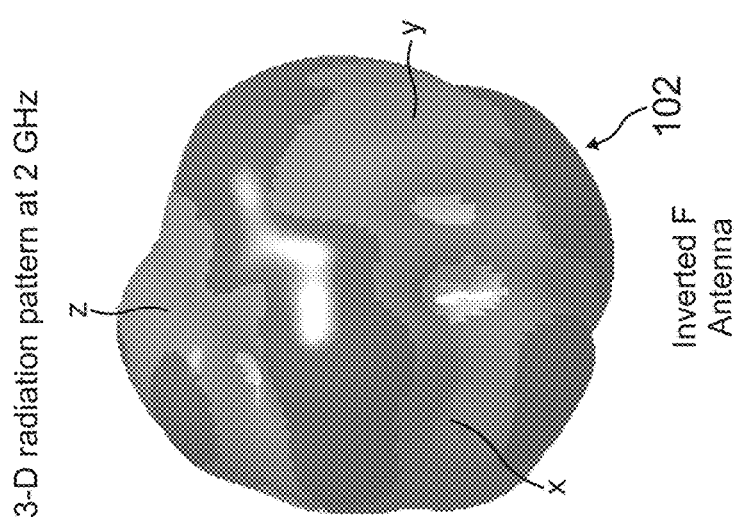
FIG. 10 is a three-dimensional plot of the radiation pattern of the F antenna of FIG. 3, according to an embodiment.

FIG. 10 is a three-dimensional plot of the radiation pattern 102 of the F antenna 52 of FIG. 3 at a frequency of 2 GHz, according to an embodiment.

Figure 11:
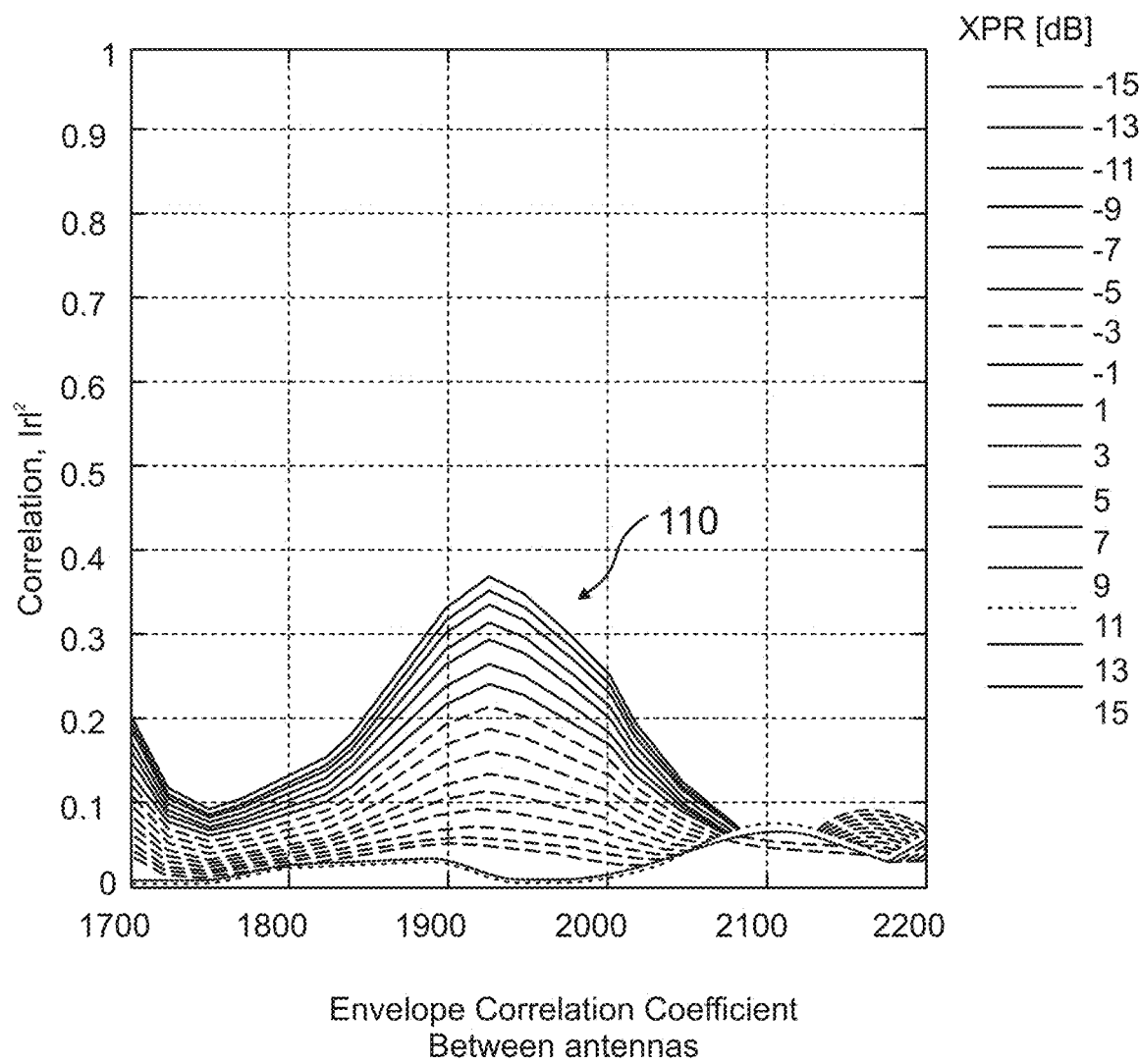
FIG. 11 is a plot of the envelope correlation coefficient, versus frequency, between the T and F antennas of FIGS. 3-4, according to an embodiment.

FIG. 11 is a plot 110 of the envelope correlation coefficient versus frequency between the T antenna 52 and the F antenna 62 of FIG. 3, according to an embodiment. At a frequency of approximately 1.75 GHz, and at frequencies above approximately 2.08 GHz, the envelope correlation coefficient is less than 0.1, which is suitable for most MIMO applications. And for all frequencies except frequencies within the approximate frequency band of 1.88 GHz-1.98 GHz, the error correction coefficient is no greater than 0.3, which is suitable for many MIMO applications.

Figure 12:
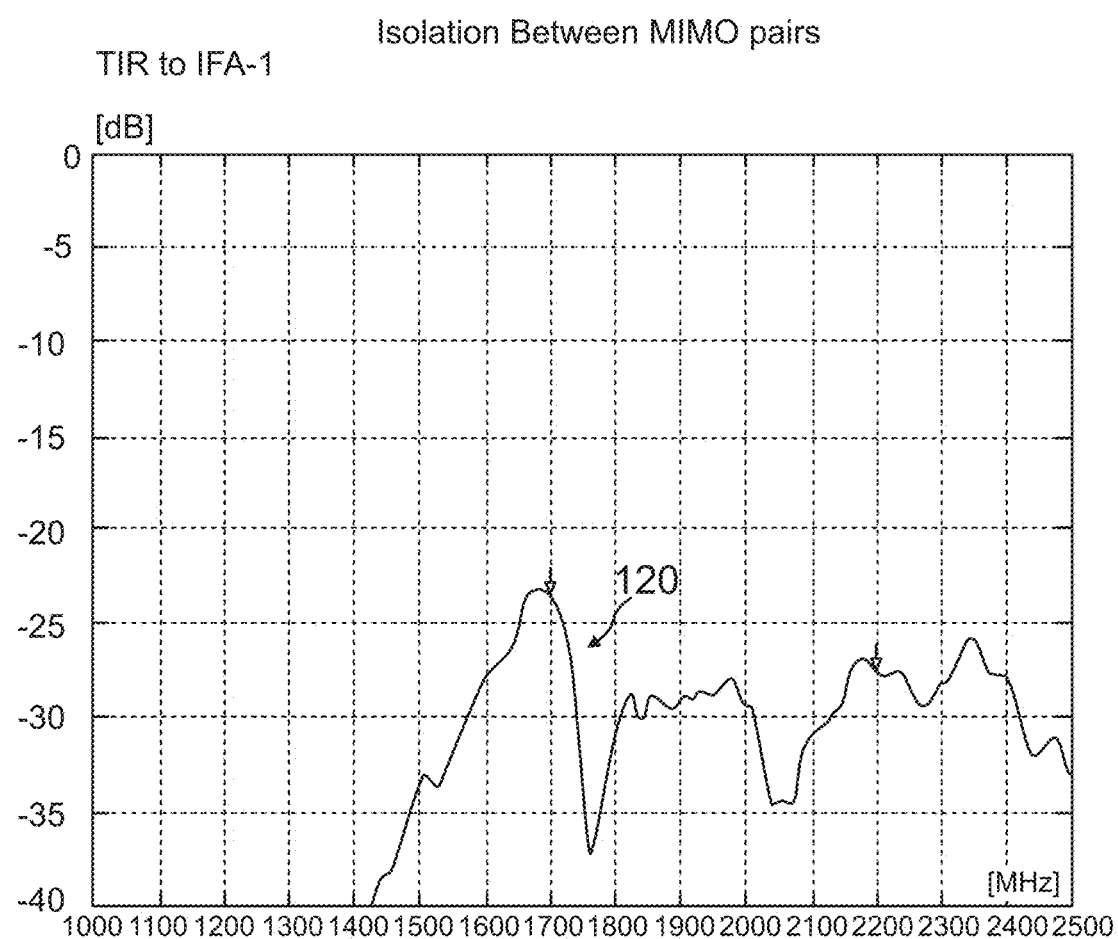
FIG. 12 is a plot of the signal isolation, versus frequency, between the T and F antennas of FIGS. 3-4, according to an embodiment.

FIG. 12 is a plot 120 of the isolation (in decibels (dB)) between the T antenna 52 and the F antenna 62 of FIG. 3, according to an embodiment. For frequencies within an approximate frequency band of 1.42 GHz-2.5 GHz, the isolation is no less than about 23 dB, which is suitable for most MIMO applications.

Figure 13:
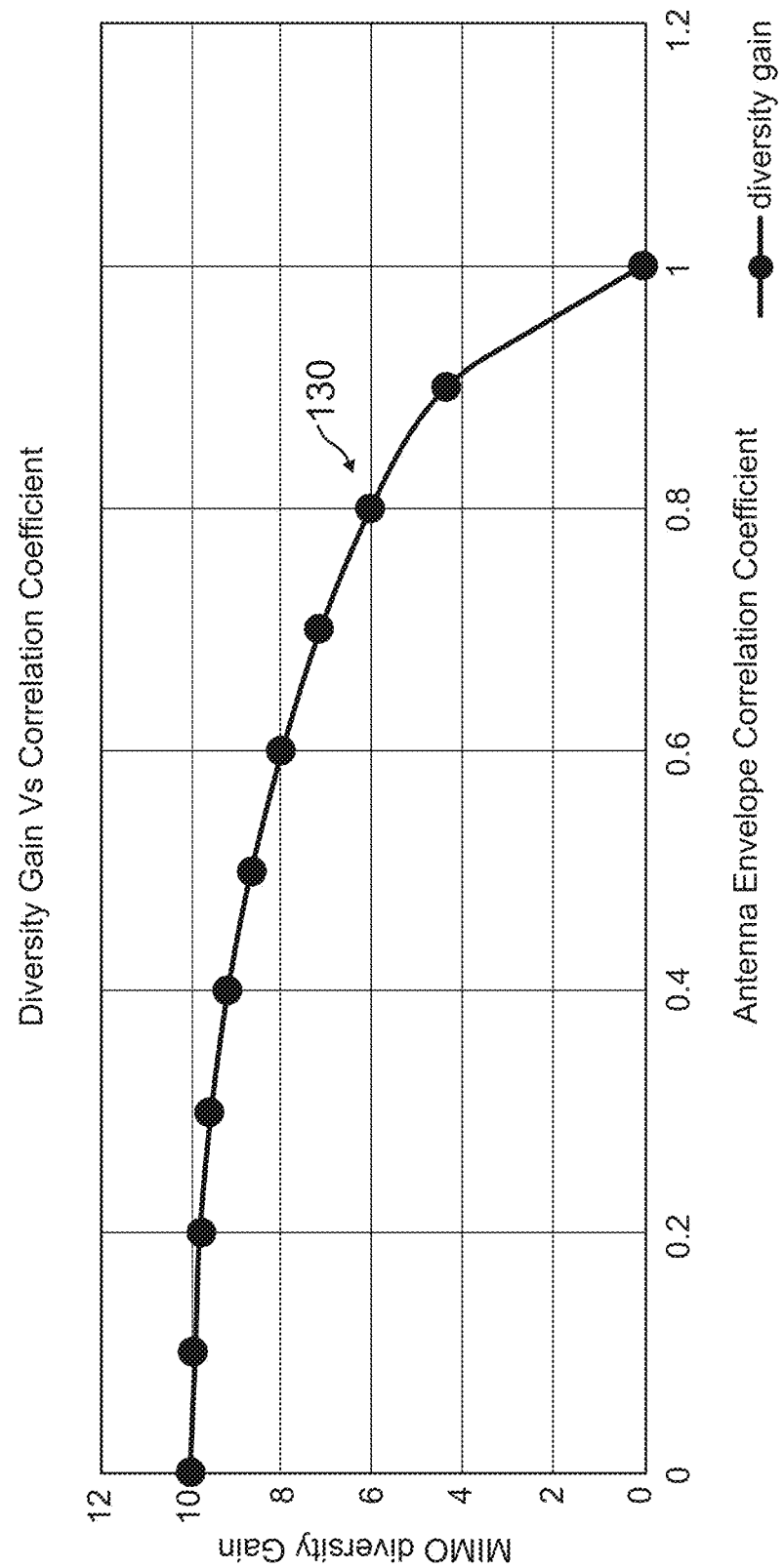
FIG. 13 is a plot of the diversity gain, versus envelope correlation coefficient, for the T and F antennas of FIGS. 3-4, according to an embodiment.

FIG. 13 is a plot 130 of the MIMO-OFDM diversity gain (in dB) versus envelope correlation coefficient for the combination of the T antenna 52 and the F antenna 62 of FIG. 3, according to an embodiment. Diversity gain is the apparent gain of the MIMO-OFDM pair of antennas 52 and 62 over the gain of a single one of these antennas. That is, assuming the individual gains of the T antenna 52 and the F antenna 62 are approximately equal and normalized to unity, the diversity gain is a measure of how many times greater is the apparent gain of the MIMO-OFDM pair of antennas than the gain of a single one of the antennas. For example, a diversity gain of 10 dB indicates that the gain of the MIMO-OFDM pair of antennas 52 and 62 is 10 dB greater than the gain of the one of the T and F antennas having the highest individual gain. In the described embodiment, the diversity gain is an approximately constant 10 dB, and the bit-error rate (BER) is approximately 1.0%, for envelope correlation coefficients up to approximately 0.3; a 10 dB diversity gain and a 1.0% BER is suitable for many MIMO-OFDM applications.

Referring again to FIGS. 3-4, operation of the antenna module 14, while it is connected to the controller module 12 (FIG. 1), is described, according to an embodiment in which the antenna module transmits and receives signals using a MIMO-OFDM technique.

During signal transmission, a remote source, such as a master unit of a DAS, sends data to the antenna module 14 via one or more pins, or other contacts, of the signal connector 56.

The antenna-module circuitry generates, and transmits via the T and F antennas 52 and 62, respective training symbols so that one or more remote (from the antenna module 14) receivers (not shown in FIGS. 3-4) can characterize the respective channels over which the T and F antennas are transmitting respective signals.

The antenna-module circuitry also splits the data into two data symbols, one for each of the T antenna 52 and F antenna 62.

The antenna-module circuitry then error encodes each of the data symbols.

The antenna-module circuitry next MIMO-OFDM encodes the error-encoded data symbols, and modulates, with respective portions of the data symbols, a number (e.g., 512, 1024) of orthogonal subcarrier signals within the frequency band for which the antenna-module 14 is configured. That is, the antenna-module circuitry generates a first set of subcarrier signals modulated with one of the data symbols, and generates a second set of subcarrier signals, at the same frequencies as the first set of subcarrier signals, modulated with the other of the data symbols. Example subcarrier-modulation techniques include Quadrature Phase-Shift Keying (QPSK) and Quadrature Amplitude Modulation (QAM) such as QAM-16 and QAM-64.

The antenna circuitry then performs, on each of the first and second sets of modulated subcarrier signals, an inverse fast Fourier Transform (IFFT), to generate respective first and second transmission data signals.

The antenna circuitry next modulates each of two carrier signals with a respective one of the first and second transmission data signals.

The antenna circuitry then provides the carrier signal modulated with the first transmission data signal to one of the T antenna 52 and F antenna 62 for transmission, and provides the carrier signal modulated with the second transmission data signal to the other of the T antenna and F antenna for transmission.

As described above in conjunction with FIGS. 3-4 and 13, because of the relatively high-diversity gain (e.g., 10 dB) exhibited by the T and F antennas 52 and 62, a receiver can recover the first and second data symbols from the received modulated carrier signals even though the first and second transmission data signals include the same subcarrier frequencies, and even if the T and F antennas are spaced apart by less than λ/2 (λ can be the center wavelength of the frequency band, or the longest wavelength of the frequency band).

Still referring to FIGS. 3-4, during signal reception from a remote MIMO-OFDM transmitter, the antenna-module circuitry demodulates the respective signals received by the T and F antennas 52 and 62 to recover first and second received data signals.

The antenna-module circuitry then subjects each of the first and second received data signals to a fast Fourier Transform (FFT), and recovers values carried by the modulated subcarriers of each of the received data signals.

The antenna-module circuitry next recovers, from the values, the two encoded data symbols generated and transmitted by the remote transmitter.

The antenna-module circuitry then MIMO-OFDM and error-correction decodes the recovered encoded data symbols to recover the two data symbols transmitted by the remote transmitter.

Referring to FIGS. 3-13, alternate embodiments of the antenna-module 14 are contemplated. For example, the antennas 52 and 62 can be other than T and F antennas. In addition, alternate embodiments described in conjunction with FIGS. 1-2B and 14-17 can be applicable to the antenna-module 14.

Figure 14:
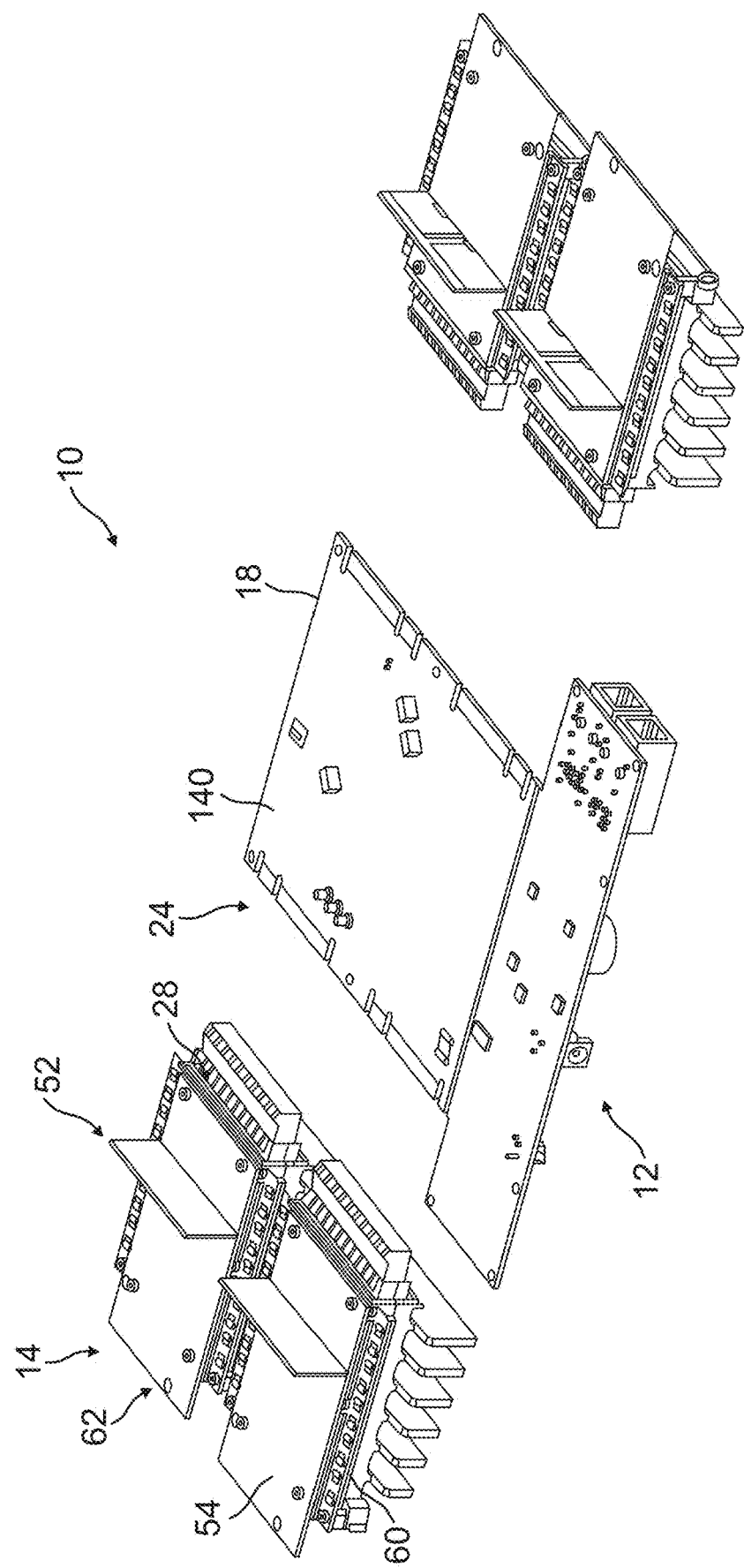
FIG. 14 is bottom exploded view of the remote antenna unit of FIG. 1 including multiple antenna modules of FIG. 3, according to an embodiment.

FIG. 14 is an exploded bottom view of the antenna unit 10 of FIG. 1, according to an embodiment.

Figure 15:
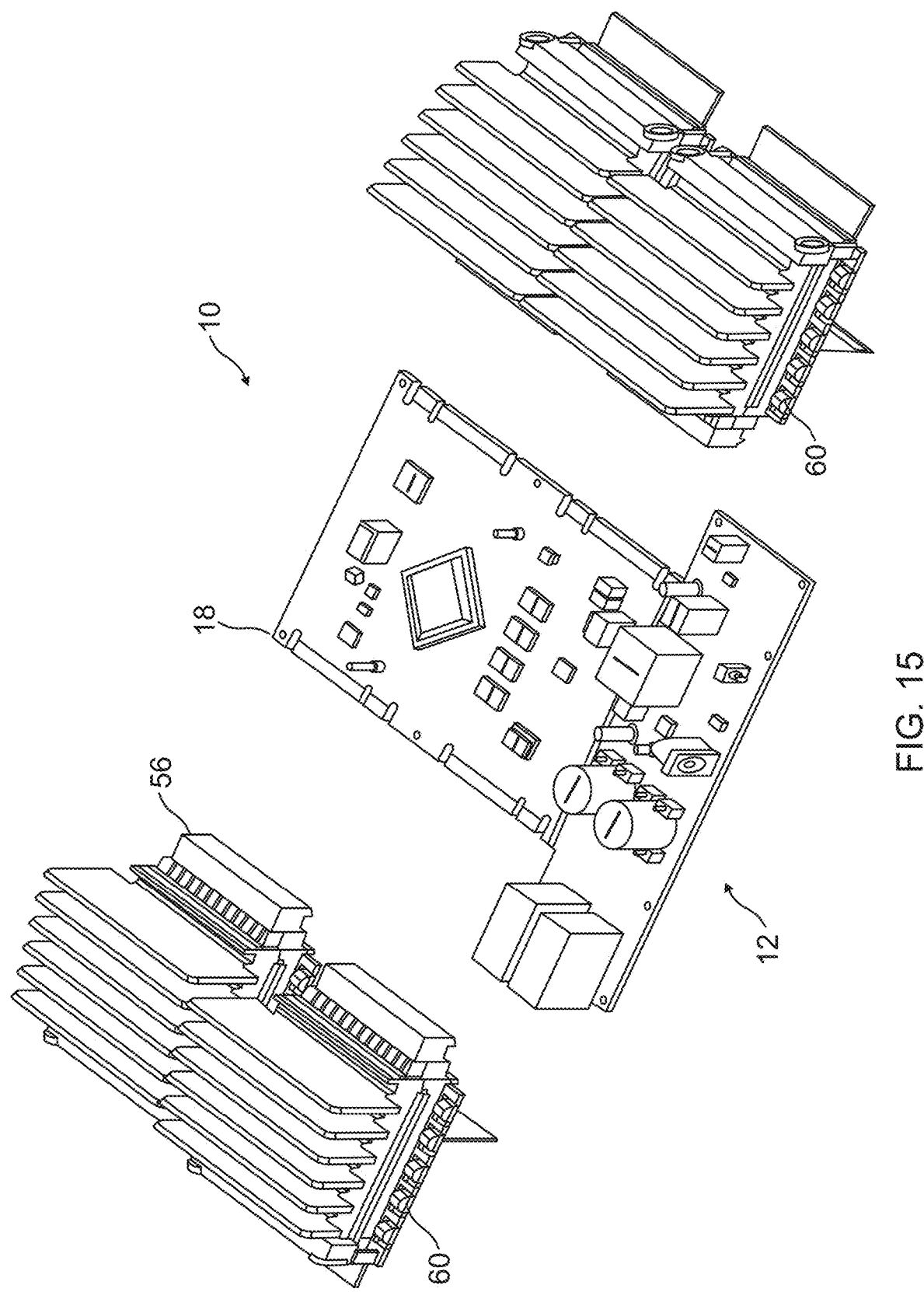
FIG. 15 is top exploded view of the remote antenna unit of FIGS. 1 and 14 including multiple antenna modules of FIG. 3, according to an embodiment.

FIG. 15 is an exploded top view of the antenna unit 10 of FIGS. 1 and 14, according to an embodiment.

Figure 16:
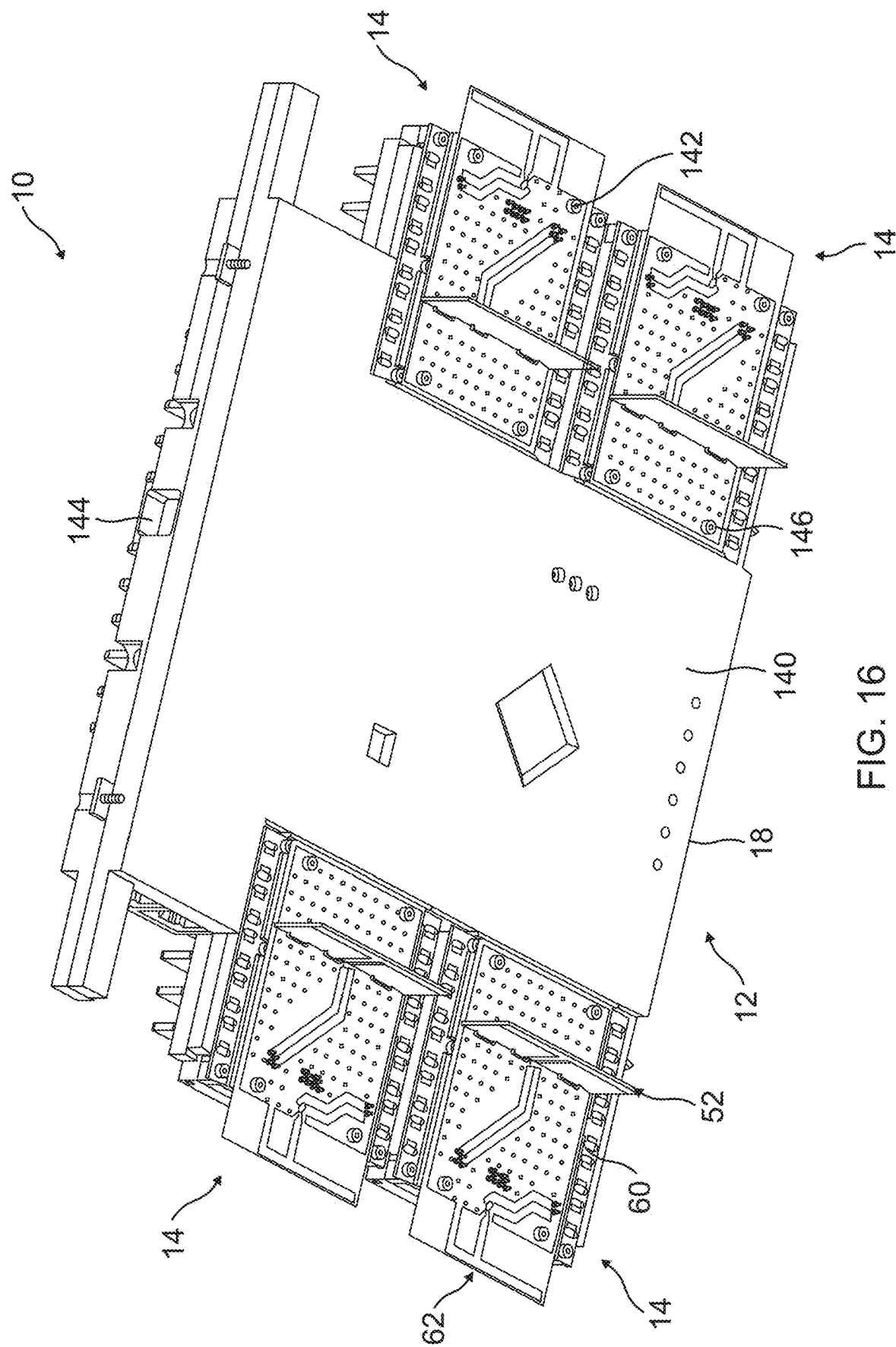
FIG. 16 is bottom view of the remote antenna unit of FIGS. 1 and 14-15 including multiple antenna modules of FIG. 3, according to an embodiment.

FIG. 16 is a bottom view of an assembled and fully populated (with antenna modules 14) antenna unit 10 of FIGS. 1 and 14-15, according to an embodiment.

Referring to FIGS. 14 and 16, the controller module 12 includes a conductive region, e.g., a ground plane, 140, which forms an outer conductive layer of the substrate 18. The ground plane 140 can be fully exposed, or can be covered with an electric insulator and exposed only in one or more regions configured for engagement with the ground-plane contacts 60 of the antenna modules 14. Alternatively, the ground plane 140 can an inner conductive layer of the substrate 18, which can include vias for coupling the ground plane to the ground-plane contacts 60.

Referring to FIG. 14, the connection region 24 of the controller module 12 is configured to slide into, and engage, the connection region 28 of a respective antenna module 14. Once the connections regions 24 and 28 are engaged, the ground-plane contacts 60 contact one or more exposed portions (not shown in FIG. 14) of the ground plane 140 of the controller module 12 to provide a low-impedance coupling of the ground plane 140 with the ground plane 54 of the antenna module 14. Such a low-impedance coupling allows the T and F antennas 52 and 62 to "see" one large ground plane such that each of the antennas has a respective radiation pattern for which it is configured (an antenna that does not "see" such a large ground plane can exhibit a degraded radiation pattern).

Referring to FIG. 15, the signal connector 56 of each antenna module 14 is configured to engage a respective signal connector (not shown in FIG. 15) disposed on the controller module 12.

Referring to FIG. 16, the assembled, and fully populated (with antenna modules 14), antenna unit 10 is configured to fit into a single enclosure (not shown in FIGS. 14-16) that is no larger than approximately 12 inches×10 inches×2 inches. That is, after one assembles the antenna unit 10, he/she can insert the antenna unit into such an enclosure, which, although not shown in FIGS. 14-16, can include/expose connectors 144 (e.g., PoE) for power and communication with a master unit of a DAS. And the enclosure can include a radome that covers the bottom side (the side with the T and F antennas 52 and 62) of the antenna unit 10.

Furthermore, the antenna modules 14 are spaced apart from one another by respective distances that are sufficient to provide a sufficient level of isolation between antennas of different antenna modules. Because, as described above in conjunction with FIGS. 3-4, the polarizations of the T and F antennas 52 and 62 are orthogonal to one another, the T antenna of one antenna module 14 typically is sufficiently isolated from the F antenna of another antenna module regardless of the distance between the antenna modules; similarly, the F antenna of one antenna module typically is sufficiently isolated from the T antenna of another antenna module regardless of the distance between the antenna modules. And even though the polarizations of T antennas 52 of different antenna modules 14, and the polarizations of F antennas 62 of different antenna modules, are approximately aligned with one another, the antenna modules are spaced apart by distances that provide a sufficient level of isolation between like antennas on different antenna modules. For example, an antenna-module separation distance in the approximate range of $\lambda/4$-$\lambda/2$ has been found to provide a suitable level of isolation (e.g., >15 dB), where $\lambda$, is the center wavelength (or longest wavelength) of the lowest-frequency band supported by any version of antenna units 14.

Moreover, if multiple antenna units 14 are configured to transmit and receive on a same frequency band, then the control circuit 20 (FIG. 1) of the controller module 12 can be configured to cause each of these antenna units to use a respective set of subcarriers to avoid signal interference between antenna modules.

Referring to FIGS. 14-16, due to the design of the connections regions 24 and 28 and the signal connector 56, one can install and remove an antenna module 14 to/from the controller module 12 quickly and easily without the need for complicated instructions, and without the need for tools and specialized procedures. Alternatively, one can secure an antenna module 14 to the controller module 12 with optional screws 146 and a standard Philip's head or flat-head screwdriver (not shown in FIGS. 14-16).

Furthermore, because the controller module 12 has only a single version, and, therefore, is common to all versions of the antenna units 14, one need not match a version of an antenna unit to a version of a controller module, or vice-versa. This can save costs, because only one version of the controller module 12 need be purchased and inventoried by a system owner, and it can save time because an installer need not waste time inadvertently installing an incorrect version of the controller module and then re-installing the correct version.

Still referring to FIGS. 14-16, alternate embodiments of the antenna unit 10 are contemplated. For example, although described as being fully populated with antenna units 14, the antenna unit 10 can be only partially populated. Furthermore, although described as being configured to engage four antenna modules 14, the antenna unit 10 can be configured to engage fewer than, or more than, four antenna modules. Moreover, although all of the antenna modules 14 are described as having a same antenna configuration (e.g., type, number, orientation of antennas), one or more of the antenna modules can have a different antenna configuration than one or more of the other antenna modules. In addition, alternate embodiments described in conjunction with FIGS. 1-13 and 17 may be applicable to the antenna unit 10.

Figure 17:
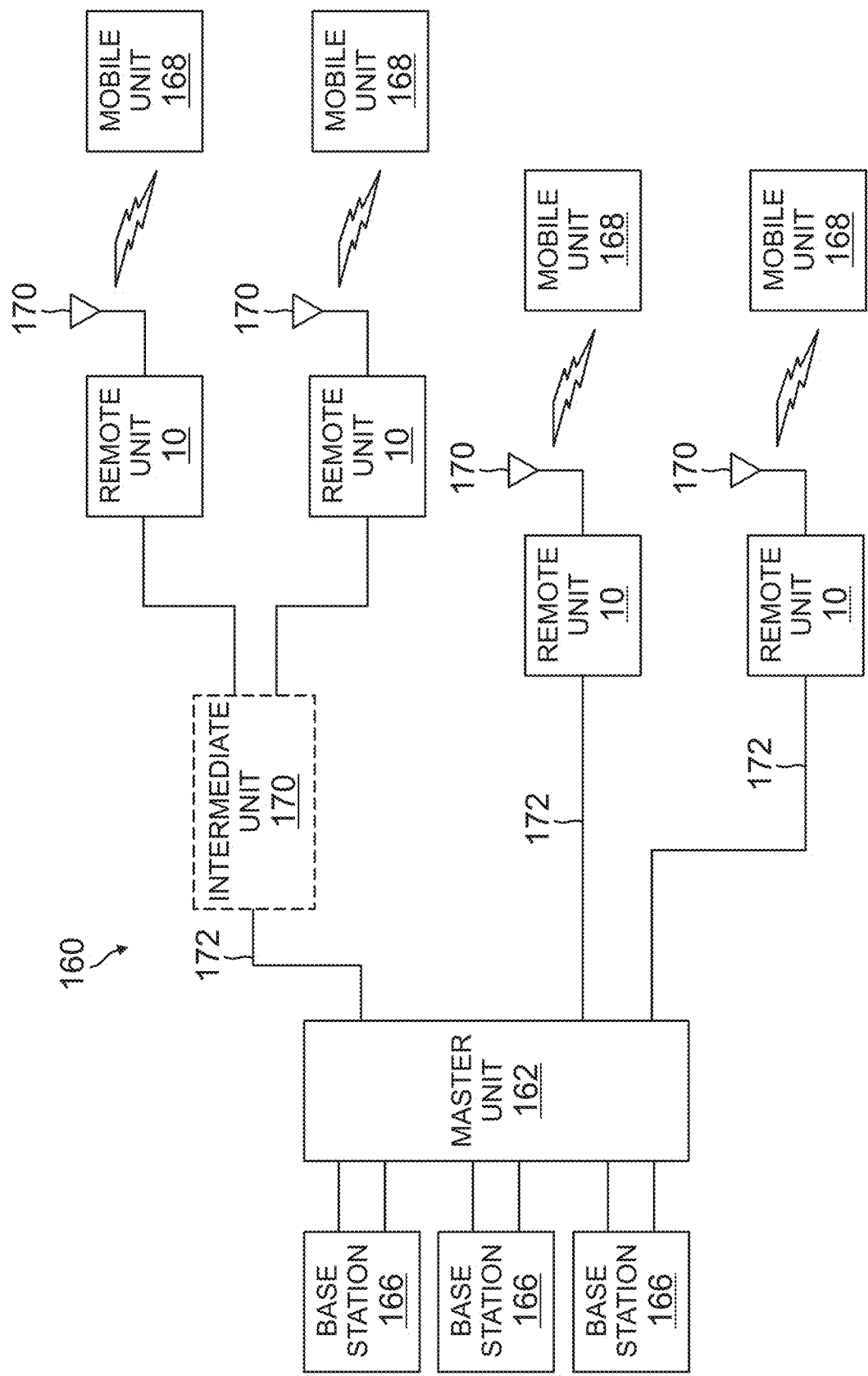
FIG. 17 is a diagram of a distributed antenna system (DAS) that incorporates one or more of the remote antenna units of FIGS. 1 and 14-16, according to an embodiment.

FIG. 17 is a block diagram of a distributed antenna system (DAS) 160, which can include one or more of the remote antenna units 10 of FIGS. 1-2B and 14-16, according to an embodiment. In the described example, at least one of the remote antenna units 10 of the DAS 160 includes at least one antenna module 14 of FIG. 3.

The DAS 160 includes one or more master units 162 and one or more remote antenna units 10 that are communicatively coupled to the master units 162. Further in this embodiment, the DAS 160 includes a digital DAS, in which DAS traffic is distributed between the master units 162 and the remote antenna units 10 in digital form. In other embodiments, the DAS 160 is implemented, at least in part, as an analog DAS, in which DAS traffic is distributed at least part of the way between the master units 162 and the remote antenna units 10 in analog form.

Each master unit 162 is communicatively coupled to one or more base stations 166. One or more of the base stations 166 can be co-located with the respective master unit 162 to which it is coupled (for example, where the base station 166 is dedicated to providing base station capacity to the DAS 160). Also, one or more of the base stations 166 can be located remotely from the respective master unit 162 to which it is coupled (for example, where the base station 166 is a macro base station providing base station capacity to a macro cell in addition to providing capacity to the DAS 160). In this latter case, a master unit 162 can be coupled to a donor antenna in order to wirelessly communicate with the remotely located base station 166.

The base stations 166 can be implemented as traditional monolithic base stations. Also, the base stations 166 can be implemented using a distributed base station architecture in which a base band unit (BBU) is coupled to one or more remote radio heads (RRHs), where the front haul between the BBU and the RRH uses streams of digital IQ samples. Examples of such an approach are described in the Common Public Radio Interface (CPRI) and Open Base Station Architecture Initiative (OBSAI) families of specifications.

The master units 162 can be configured to use wideband interfaces or narrowband interfaces to the base stations 166. Also, the master units 162 can be configured to interface with the base stations 166 using analog radio frequency (RF) interfaces or digital interfaces (for example, using a CPRI or OBSAI digital IQ interface).

Traditionally, each master unit 162 interfaces with each base station 166 using the analog radio frequency signals that each base station 166 communicates to and from mobile units 168 using a suitable air interface standard. The DAS 160 operates as a distributed repeater for such radio frequency signals. RF signals transmitted from each base station 166 (also referred to herein as "downlink RF signals") are received at one or more master units 162. Each master unit 162 uses the downlink RF signals to generate a downlink transport signal that is distributed to one or more of the remote units 164. Each such remote antenna unit 10 receives the downlink transport signal and reconstructs a version of the downlink RF signals based on the downlink transport signal and causes the reconstructed downlink RF signals to be radiated from at least one antenna array 170 (e.g., at least one array of the T and F antennas 52 and 56 of FIGS. 3-4 and 14-16) coupled to or included in that remote antenna unit 10.

A similar process is performed in the uplink direction. RF signals transmitted from mobile units 168 (also referred to herein as "uplink RF signals") are received at one or more remote antenna units 10. Each remote unit 10 uses the uplink RF signals to generate an uplink transport signal that is transmitted from the remote unit 10 to a master unit 162. Each master unit 162 receives uplink transport signals transmitted from one or more remote units 10 coupled to it. The master unit 162 combines data or signals communicated via the uplink transport signals received at the master unit 162 and reconstructs a version of the uplink RF signals received at the remote units 10. The master unit 162 communicates the reconstructed uplink RF signals to one or more base stations 166. In this way, the coverage of the base stations 166 can be expanded using the DAS 160.

One or more intermediate units 170 (some of which are also referred to here as "expansion units" 170) can be placed between the master units 162 and one or more of the remote units 10. This can be done, for example, in order to increase the number of remote units 10 that a single master unit 162 can feed, to increase the master-unit-to-remote-unit distance, and/or to reduce the amount of cabling needed to couple a master unit 162 to its associated remote units 10.

As noted above, the DAS 160 is implemented as a digital DAS. In a "digital" DAS, signals received from and provided to the base stations 166 and mobile units 168 are used to produce digital in-phase (I) and quadrature (Q) samples, which are communicated between the master units 162 and remote units 10. It is important to note that this digital IQ representation of the original signals received from the base stations 166 and from the mobile units 168 still maintains the original modulation (that is, the change in the amplitude, phase, or frequency of a carrier) used to convey telephony or data information pursuant to the cellular air interface protocol used for wirelessly communicating between the base stations 166 and the mobile units 168. Examples of such cellular air interface protocols include, for example, the Global System for Mobile Communication (GSM), Universal Mobile Telecommunications System (UMTS), High-Speed Downlink Packet Access (HSDPA), and Long-Term Evolution (LTE) air interface protocols. Also, each stream of digital IQ samples represents or includes a portion of wireless spectrum. For example, the digital IQ samples can represent a single radio access network carrier (for example, a UMTS or LTE carrier of 5 MHz) onto which voice or data information has been modulated using a UMTS or LTE air interface. However, it is to be understood that each such stream can also represent multiple carriers (for example, in a band of frequency spectrum or a sub-band of a given band of frequency spectrum).

Furthermore, one or more of the master units 162 are configured to interface with one or more base stations 166 using an analog RF interface (for example, either a traditional monolithic base station 166 or via the analog RF interface of an RRH). The base stations 166 can be coupled to the master units 162 using a network of attenuators, combiners, splitters, amplifiers, filters, cross-connects, etc., (sometimes referred to collectively as a "point-of-interface" or "POI"). This is done so that, in the downstream, the desired set of RF carriers output by the base stations 166 can be extracted, combined, and routed to the appropriate master unit 162, and so that, in the upstream, the desired set of carriers output by the master unit 162 can be extracted, combined, and routed to the appropriate interface of each base station 166.

Each master unit 162 can produce digital IQ samples from an analog wireless signal received at radio frequency (RF) by down-converting the received signal to an intermediate frequency (IF) or to baseband, digitizing the down-converted signal to produce real digital samples, and digitally down-converting the real digital samples to produce digital in-phase (I) and quadrature (Q) samples. These digital IQ samples can also be filtered, amplified, attenuated, and/or re-sampled or decimated to a lower sample rate. The digital samples can be produced in other ways. Each stream of digital IQ samples represents a portion of wireless radio frequency spectrum output by one or more base stations 166. Each portion of wireless radio frequency spectrum can include, for example, a band of wireless spectrum, a sub-band of a given band of wireless spectrum, or an individual wireless carrier.

Likewise, in the upstream, each master unit 162 can produce an upstream analog wireless signal from one or more streams of digital IQ samples received from one or more remote units 10 by digitally combining streams of digital IQ samples that represent the same carriers or frequency bands or sub-bands (for example, by digitally summing such digital IQ samples), digitally up-converting the combined digital IQ samples to produce real digital samples, performing a digital-to-analog process on the real samples in order to produce an IF or baseband analog signal, and up-converting the IF or baseband analog signal to the desired RF frequency. The digital IQ samples can also be filtered, amplified, attenuated, and/or re-sampled or interpolated to a higher sample rate, before and/or after being combined. The analog signal can be produced in other ways (for example, where the digital IQ samples are provided to a quadrature digital-to-analog converter that directly produces the analog IF or baseband signal).

One or more of the master units 162 can be configured to interface with one or more base stations 166 using a digital interface (in addition to, or instead of) interfacing with one or more base stations 166 via an analog RF interface. For example, the master unit 162 can be configured to interact directly with one or more BBUs using the digital IQ interface that is used for communicating between the BBUs and an RRHs (for example, using the CPRI serial digital IQ interface).

In the downstream, each master unit 162 terminates one or more downstream streams of digital IQ samples provided to it from one or more BBUs and, if necessary, converts (by re-sampling, synchronizing, combining, separating, gain adjusting, etc.) them into downstream streams of digital IQ samples compatible with the remote units 10 used in the DAS 160. In the upstream, each master unit 162 receives upstream streams of digital IQ samples from one or more remote units 10, digitally combining streams of digital IQ samples that represent the same carriers or frequency bands or sub-bands (for example, by digitally summing such digital IQ samples), and, if necessary, converts (by re-sampling, synchronizing, combining, separating, gain adjusting, etc.) them into upstream streams of digital IQ samples compatible with the one or more BBUs that are coupled to that master unit 162.

Each master unit 162 can be implemented in other ways.

In the downstream, each remote unit 10 receives streams of digital IQ samples from one or more master units 162, where each stream of digital IQ samples represents a portion of wireless radio frequency spectrum output by one or more base stations 166.

Each remote unit 164 is communicatively coupled to one or more master units 162 using one or more ETHERNET-compatible cables 172 (for example, one or more CAT-6A cables). In this embodiment, each remote unit 10 can be directly connected to a master unit 162 via a single ETHERNET cable 172 or indirectly via multiple ETHERNET-compatible cables 172 such as where a first ETHERNET cable 172 connects the remote unit 10 to a patch panel or expansion/intermediate unit 170 and a second optical fiber cable 172 connects the patch panel or expansion/intermediate unit 170 to the master unit 162. Each remote unit 10 can be coupled to one or more master units 162 in other ways. And the master unit 162 or expansion/intermediate unit(s) 170 can include one or more PSEs 14 (FIG. 1) that are configured to provide power to the remote units 10 as described above in conjunction with FIGS. 1-3 and 14-16.

Figure 18:
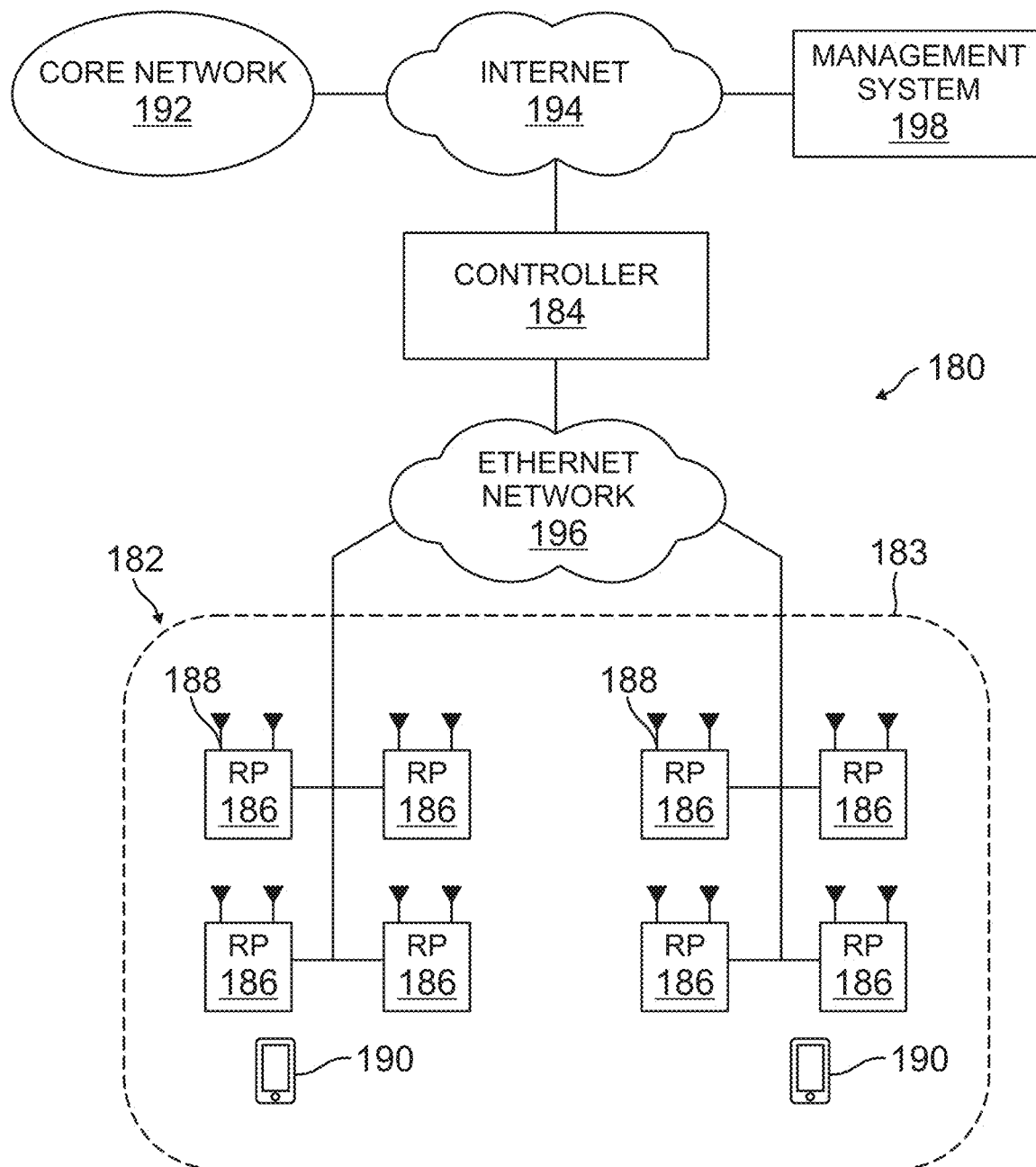
FIG. 18 is a diagram of a centralized radio access network (C-RAN) that incorporates one or more of the remote antenna units of FIGS. 1 and 14-16, according to an embodiment.

FIG. 18 is a block diagram of a centralized radio access network (C-RAN) 180, which can include one or more of the remote antenna units 10 of FIGS. 1-2B and 14-16, according to an embodiment. In the described example, at least one of the remote antenna units 10 of the C-RAN 180 includes at least one antenna module 14 of FIG. 3. Furthermore, hereinafter the remote antenna units 10 are referred to as radio points (RPs) 186.

A centralized radio access network (C-RAN) is one way to implement base station functionality. Typically, for each cell implemented by a C-RAN, a single baseband unit (BBU) interacts with multiple radio points in order to provide wireless service to various items of user equipment (UEs).

FIG. 18 is a block diagram illustrating one exemplary embodiment of a radio access network (RAN) system 180 in which one or more remote antenna units 10 of FIGS. 1-2B and 14-16, hereinafter referred to as radio points, or RPs, 186, can be implemented. The system 180 is deployed at a site 182 to provide wireless coverage and capacity for one or more wireless network operators. The site 182 may be, for example, a building or campus or other grouping of buildings (used, for example, by one or more businesses, governments, other enterprise entities) or some other public venue (such as a hotel, resort, amusement park, hospital, shopping center, airport, university campus, arena, or an outdoor area such as a ski area, stadium or a densely-populated downtown area).

In the exemplary embodiment shown in FIG. 18, the system 180 is implemented at least in part using a C-RAN (point-to-multipoint distributed base station) architecture that employs at least one baseband unit 184 and multiple radio points (RPs) 186 serve at least one cell 183. The system 180 is also referred to here as a "C-RAN system" 180. The baseband units 184 are also referred to here as "baseband controllers" 184 or just "controllers" 184. Each RP 186 includes or is coupled to one or more antennas 188 via which downlink RF signals are radiated to user equipment (UE) 190 and via which uplink RF signals transmitted by UEs 190 are received.

More specifically, in the example shown in FIG. 18, each RP 186 comprises two antennas 188. Each RP 186 can include or be coupled to a different number of antennas 188.

The system 180 is coupled to the core network 192 of each wireless network operator over an appropriate back-haul. In the exemplary embodiment shown in FIG. 18, the Internet 194 is used for back-haul between the system 180 and each core network 192. However, it is to be understood that the back-haul can be implemented in other ways.

The exemplary embodiment of the system 180 shown in FIG. 18 is described here as being implemented as a Long Term Evolution (LTE) radio access network providing wireless service using an LTE air interface. LTE is a standard developed by 3GPP standards organization. In this embodiment, the controller 184 and RPs 186 together are used to implement an LTE Evolved Node B (also referred to here as an "eNodeB" or "eNB") that is used to provide user equipment 190 with mobile access to the wireless network operator's core network 192 to enable the user equipment 190 to wirelessly communicate data and voice (using, for example, Voice over LTE (VoLTE) technology).

Also, in this exemplary LTE embodiment, each core network 192 is implemented as an Evolved Packet Core (EPC) 192 comprising standard LTE EPC network elements such as, for example, a mobility management entity (MME) (not shown) and a Serving Gateway (SGW) (not shown) and, optionally, a Home eNodeB gateway (HeNB GW) (not shown) and a Security Gateway (SeGW) (not shown).

Moreover, in this exemplary embodiment, each controller 184 communicates with the MME and SGW in the EPC core network 192 using the LTE S1 interface and communicates with other eNodeBs using the LTE X2 interface. For example, the controller 184 can communicate with an outdoor macro eNodeB (not shown) via the LTE X2 interface.

Each controller 184 and the radio points 186 can be implemented so as to use an air interface that supports one or more of frequency-division duplexing (FDD) and/or time-division duplexing (TDD). Also, the controller 184 and the radio points 186 can be implemented to use an air interface that supports one or more of the multiple-input-multiple-output (MIMO), single-input-single-output (SISO), single-input-multiple-output (SIMO), multiple-input-single-output (MISO), and/or beam forming schemes. For example, the controller 184 and the radio points 186 can implement one or more of the LTE transmission modes. Moreover, the controller 184 and/or the radio points 186 can be configured to support multiple air interfaces and/or to support multiple wireless operators.

In the exemplary embodiment shown in FIG. 18, the front-haul that communicatively couples each controller 184 to the one or more RPs 186 is implemented using a standard ETHERNET network 196. However, it is to be understood that the front-haul between the controllers 184 and RPs 186 can be implemented in other ways.

Generally, one or more nodes in a C-RAN perform analog radio frequency (RF) functions for the air interface as well as digital Layer 1, Layer 2, and Layer 3 (of the Open Systems Interconnection (OSI) model) functions for the air interface.

In the exemplary embodiment shown in (L1) FIG. 18, each baseband controller 184 comprises Layer-3 (L3) functionality 200, Layer-2 (L2) functionality 202, and Layer-1 (L1) functionality 204 configured to perform at least some of the Layer-3 processing, Layer-2 processing, and Layer-1 processing, respectively, for the LTE air interface implemented by the RAN system 180, and each RP 186 includes (optionally) Layer-1 functionality (not shown) that implements any Layer-1 processing for the air interface that is not performed in the controller 184 and one or more radio frequency (RF) circuits (not shown) that implement the RF front-end functions for the air interface and the one or more antennas 188 associated with that RP 186.

Each baseband controller 184 can be configured to perform all of the digital Layer-3, Layer-2, and Layer-1 processing for the air interface, while the RPs 186 (specifically, the RF circuits) implement only the RF functions for the air interface and the antennas 188 associated with each RP 186. In that case, IQ data representing time-domain symbols for the air interface is communicated between the controller 184 and the RPs 186. Communicating such time-domain IQ data typically requires a relatively high data rate front haul. This approach (communicating time-domain IQ data over the front haul) is suitable for those implementations where the front-haul ETHERNET network 116 is able to deliver the required high data rate.

If the front-haul ETHERNET network 196 is not able to deliver the data rate needed to front haul time-domain IQ data (for example, where the front-haul is implemented using typical enterprise-grade ETHERNET networks), this issue can be addressed by communicating IQ data representing frequency-domain symbols for the air interface between the controllers 184 and the RPs 186. This frequency-domain IQ data represents the symbols in the frequency domain before the inverse fast Fourier transform (IFFT) is performed. The time-domain IQ data can be generated by quantizing the IQ data representing the frequency-domain symbols without guard band zeroes or any cyclic prefix and communicating the resulting compressed, quantized frequency-domain IQ data over the front-haul ETHERNET network 196. Additional details regarding this approach to communicating frequency-domain IQ data can be found in U.S. patent application Ser. No. 13/762,283, filed on Feb. 7, 2013, and titled "RADIO ACCESS NETWORKS," which is hereby incorporated herein by reference.

Where frequency-domain IQ data is front-hauled between the controllers 184 and the RPs 186, each baseband controller 184 can be configured to perform all or some of the digital Layer-3, Layer-2, and Layer-1 processing for the air interface. In this case, the Layer-1 functions in each RP 186 can be configured to implement the digital Layer-1 processing for the air interface that is not performed in the controller 184.

Where the front-haul ETHERNET network 196 is not able to deliver the data rate need to front haul (uncompressed) time-domain IQ data, the time-domain IQ data can be compressed prior to being communicated over the ETHERNET network 196, thereby reducing the data rate needed communicate such IQ data over the ETHERNET network 196.

Data can be front-hauled between the controllers 184 and RPs 186 in other ways (for example, using front-haul interfaces and techniques specified in the Common Public Radio Interface (CPRI) and/or Open Base Station Architecture Initiative (OBSAI) family of specifications).

Each controller 184 and RP 186 (and the functionality described as being included therein) can be implemented in hardware, software, or combinations of hardware and software, and the various implementations (whether hardware, software, or combinations of hardware and software) can also be referred to generally as "circuitry" or a "circuit" configured to implement at least some of the associated functionality. When implemented in software, such software can be implemented in software or firmware executing on one or more suitable programmable processors. Such hardware or software (or portions thereof) can be implemented in other ways (for example, in a field programmable gate array (FPGA), application specific integrated circuit (ASIC), etc.). Also, the RF functionality can be implemented using one or more RF integrated circuits (RFICs) and/or discrete components. Each controller 184 and RP 186 can be implemented in other ways.

In the exemplary embodiment shown in FIG. 18, a management system 198 is communicatively coupled to the controllers 184 and RPs 186, for example, via the Internet 194 and ETHERNET network 196 (in the case of the RPs 186).

In the exemplary embodiment shown in FIG. 18, the management system 198 communicates with the various elements of the system 180 using the Internet 194 and the ETHERNET network 196. Also, in some implementations, the management system 198 sends and receives management communications to and from the controllers 184, each of which in turn forwards relevant management communications to and from the RPs 186.

Referring to FIGS. 17-18, alternate embodiments of the systems 160 and 180 are contemplated.

The methods and techniques described herein may be implemented in analog electronic circuitry, digital electronic circuitry, or with a programmable processor (for example, a special-purpose processor, a general-purpose processor such as a computer, a microprocessor, or microcontroller) firmware, software, or in combinations of them. Apparatuses embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Example Embodiments

Example 1 includes an antenna module, comprising: a first substrate; a first antenna disposed on the first substrate and configured to radiate a first signal having a wavelength and a first polarization; and a second antenna disposed on the first substrate and configured to radiate a second signal having the wavelength and a second polarization that is approximately orthogonal to the first polarization.

Example 2 includes the antenna module of Example lwherein the first substrate includes a printed circuit board.

Example 3 includes the antenna module of any of Examples 1-2 wherein: the first substrate has an area and a conductive region that spans more than half of the area; one of the first and second antennas is disposed adjacent to the conductive region; and the other of the first and second antennas is disposed over the conductive region.

Example 4 includes the antenna module of any of Examples 1-3 wherein: one of the first and second antennas includes a conductive trace disposed on the first substrate; and the other of the first and second antennas is disposed on a second substrate that is disposed over, and electrically coupled to, the first substrate.

Example 5 includes the antenna module of any of Examples 1-4 wherein: the one of the first and second antennas includes a T antenna; and the other of the first and second antennas includes an F antenna.

Example 6 includes the antenna module of any of Examples 1-5 wherein: the first substrate has an area and a conductive region that spans more than half of the area and has an edge; and the T antenna is disposed over, and at least one fourth the wavelength from the edge of, the conductive region.

Example 7 includes the antenna module of any of Examples 1-6 wherein: one of the first and second antennas includes a T antenna; and the other of the first and second antennas includes an F antenna.

Example 8 includes the antenna module of any of Examples 1-7 wherein: the first and second polarizations respectively include first and second E-field polarizations; one of the first and second E-field polarizations is approximately parallel to the substrate; and the other of the first and second E-field polarizations is approximately orthogonal to the substrate.

Example 9 includes the antenna module of any of Examples 1-8 wherein the second antenna is spaced from the first antenna by a distance that is less than one half the wavelength.

Example 10 includes an antenna unit, comprising: a control module including a first substrate and at least one antenna-module connection region; and at least one antenna module each configured for engagement with an antenna-module connection region of the control module, and each including a respective second substrate, a respective first antenna disposed on the respective second substrate and configured to radiate a respective first signal having a respective wavelength and a respective first polarization, and a respective second antenna disposed on the respective second substrate and configured to radiate a respective second signal having the respective wavelength and a respective second polarization that is approximately orthogonal to the respective first polarization.

Example 11 includes the antenna unit of Example 10 wherein the control module includes a control circuit disposed on the first substrate.

Example 12 includes the antenna unit of any of Examples 10-11 wherein: the respective wavelength associated with one of the at least one antenna module corresponds to a frequency band; and the respective wavelength associated with another one of the at least one antenna module corresponds to a different frequency band.

Example 13 includes the antenna unit of any of Examples 10-12 wherein: the controller module includes an approximately planar first conductor disposed on the first substrate; and each antenna module includes a respective approximately planar second conductor disposed on the respective second substrate, and a respective at least one conductive contact configured to couple, electrically, the respective second conductor to the first conductor while the antenna module is engaged with an antenna-module connection region of the controller module.

Example 14 includes the antenna unit of any of Examples 10-13 wherein each of the at least one conductive contact includes a respective D-shaped spring contact.

Example 15 includes the antenna unit of any of Examples 10-14 wherein: each of the at least one antenna-module connection region of the controller module includes a respective first signal connector; and each of the at least one antenna module includes a respective second signal connector configured to engage a first signal connector of the controller module.

Example 16 includes the antenna unit of any of Examples 10-15 wherein each of the at least one antenna module is engaged with a respective antenna-module connection region of the control module.

Example 17 includes a distributed antenna system, comprising: a master unit; and at least one remote antenna unit coupled to the master unit and including a control module including a first substrate and at least one antenna-module connection region; and at least one antenna module each configured to engage one of the at least one antenna-module connection region, and each including a respective second substrate, a respective first antenna disposed on the respective second substrate and configured to radiate a respective first signal having a respective wavelength and a respective first polarization, and a respective second antenna disposed on the respective second substrate and configured to radiate a respective second signal having the respective wavelength and a respective second polarization that is approximately orthogonal to the respective first polarization.

Example 18 includes the distributed antenna system of Examples 17 wherein each of the at least one antenna module is engaged with a respective antenna-module connection region of the control module.

Example 19 includes a method, comprising: radiating, from a first antenna, a first signal having a wavelength and a first polarization and carrying data that forms a first portion of a data symbol; and radiating, from a second antenna, a second signal having the wavelength, having a second polarization that is approximately orthogonal to the first polarization, and carrying data that forms a second portion of the data symbol.

Example 20 includes the method of Example 19, wherein: radiating the first signal from the first antenna includes radiating the first signal from one of a T antenna and an F antenna; radiating the second signal from the second antenna includes radiating the second signal from the other one of the T antenna and the F antenna.

Example 21 includes the method of any of Examples 19-20 wherein the first antenna is spaced from the second antenna by a distance less than one half the wavelength.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

The invention claimed is:
1. An antenna module, comprising:
a first substrate;
an F antenna disposed on the first substrate and configured to radiate a first signal having a wavelength and a first polarization approximately parallel to the first substrate; and
a T antenna disposed on the first substrate and configured to radiate a second signal having the wavelength and a second polarization approximately orthogonal to the first substrate.
2. The antenna module of claim 1 wherein the first substrate includes a printed circuit board.

3. The antenna module of claim 1 wherein:
the first substrate has an area and a conductive region that spans more than half of the area;
one of the F and T antennas is disposed adjacent to the conductive region; and
the other of the F and T antennas is disposed over the conductive region.

4. The antenna module of claim 1 wherein:
the F antenna includes a conductive trace disposed on the first substrate; and
the T antenna is disposed on a second substrate that is disposed over, and electrically coupled to, the first substrate.

5. The antenna module of claim 1 wherein the first and second polarizations respectively include first and second E-field polarizations.

6. The antenna module of claim 1 wherein the T antenna is spaced from the F antenna by a distance that is less than one half the wavelength.

7. An antenna module, comprising:
a first substrate having
an area, and
a conductive region that spans more than half of the area and that has an edge;
a second substrate that is disposed over, and that is electrically coupled to the first substrate:
an F antenna having a conductive trace disposed on the first substrate and configured to radiate a first signal having a wavelength and a first polarization; and
a T antenna disposed on the second substrate over, and at least one fourth the wavelength from the edge of, the conductive region, and configured to radiate a second signal having the wavelength and a second polarization that is approximately orthogonal to the first polarization.

8. An antenna unit, comprising:
a control module including a first substrate and at least one antenna-module connection region; and
at least one antenna module each configured for engagement with an antenna-module connection region of the control module, and each including
a respective second substrate,
a respective F antenna disposed on the respective second substrate and configured to radiate a respective first signal having a respective wavelength and a respective first polarization that is approximately parallel to the respective second substrate, and
a respective T antenna disposed on the respective second substrate and configured to radiate a respective second signal having the respective wavelength and a respective second polarization that is approximately orthogonal to the respective second substrate.

9. The antenna unit of claim 8 wherein the control module includes a control circuit disposed on the first substrate.

10. The antenna unit of claim 8 wherein:
the respective wavelength associated with one of the at least one antenna module corresponds to a frequency band; and
the respective wavelength associated with another one of the at least one antenna module corresponds to a different frequency band.

11. The antenna unit of claim 8 wherein:
the controller module includes an approximately planar first conductor disposed on the first substrate; and
each antenna module includes
a respective approximately planar second conductor disposed on the respective second substrate, and
a respective at least one conductive contact configured to couple, electrically, the respective second conductor to the first conductor while the antenna module is engaged with an antenna-module connection region of the controller module.

12. The antenna unit of claim 11 wherein each of the at least one conductive contact includes a respective D-shaped spring contact.

13. The antenna unit of claim 8 wherein:
each of the at least one antenna-module connection region of the controller module includes a respective first signal connector; and
each of the at least one antenna module includes a respective second signal connector configured to engage a first signal connector of the controller module.

14. The antenna unit of claim 8 wherein each of the at least one antenna module is engaged with a respective antenna-module connection region of the control module.

15. A distributed antenna system, comprising:
a master unit; and
at least one remote antenna unit coupled to the master unit and including
a control module including a first substrate and at least one antenna-module connection region; and
at least one antenna module each configured to engage one of the at least one antenna-module connection region, and each including
a respective second substrate,
a respective F antenna disposed on the respective second substrate and configured to radiate a respective first signal having a respective wavelength and a respective first polarization approximately parallel to the respective second substrate; and
a respective T antenna disposed on the respective second substrate and configured to radiate a respective second signal having the respective wavelength and a respective second polarization that is approximately orthogonal to the respective second substrate.

16. The distributed antenna system of claim 15 wherein each of the at least one antenna module is engaged with a respective antenna-module connection region of the control module.

* * * * *